United States Patent
Uchida

(10) Patent No.: US 9,668,063 B2
(45) Date of Patent: May 30, 2017

(54) CAPACITANCE TYPE SENSOR, ACOUSTIC SENSOR, AND MICROPHONE

(71) Applicant: OMRON Corporation, Kyoto-shi, Kyoto (JP)

(72) Inventor: Yuki Uchida, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 14/772,108

(22) PCT Filed: Sep. 9, 2013

(86) PCT No.: PCT/JP2013/074210
§ 371 (c)(1),
(2) Date: Sep. 2, 2015

(87) PCT Pub. No.: WO2014/141508
PCT Pub. Date: Sep. 18, 2014

(65) Prior Publication Data
US 2016/0037266 A1 Feb. 4, 2016

(30) Foreign Application Priority Data
Mar. 13, 2013 (JP) .................. 2013-050709

(51) Int. Cl.
*H04R 19/04* (2006.01)
*H04R 1/24* (2006.01)
*H04R 3/06* (2006.01)
*H04R 19/00* (2006.01)
*H04R 3/00* (2006.01)
*H04R 1/04* (2006.01)
(Continued)

(52) U.S. Cl.
CPC .............. *H04R 19/04* (2013.01); *B81B 3/00* (2013.01); *G10K 11/002* (2013.01); *H04R 1/245* (2013.01); *H04R 3/002* (2013.01); *H04R 3/06* (2013.01); *H04R 7/06* (2013.01); *H04R 19/005* (2013.01); *H04R 1/04* (2013.01); *H04R 3/005* (2013.01); *H04R 2201/003* (2013.01); *H04R 2410/03* (2013.01); *H04R 2499/11* (2013.01)

(58) Field of Classification Search
CPC ........ H04R 19/04; H04R 1/245; H04R 3/002; H04R 3/06; H04R 19/005; H04R 1/04; H04R 3/005; H04R 2410/03; H04R 2499/01; B81B 3/00; G10K 11/002
See application file for complete search history.

(56) References Cited

U.S. PATENT DOCUMENTS

2007/0047746 A1 3/2007 Weigold et al.
2009/0316916 A1 12/2009 Haila et al.
2010/0183167 A1 7/2010 Phelps et al.

FOREIGN PATENT DOCUMENTS

JP 2008-245267 A 10/2008

*Primary Examiner* — Sonia Gay
(74) *Attorney, Agent, or Firm* — Mots Law, PLLC

(57) ABSTRACT

A chamber that penetrates vertically is formed in a silicon substrate. A diaphragm is arranged on the upper surface of the silicon substrate so as to cover the upper opening of the chamber. The diaphragm is divided by slits into a region located above the chamber (first diaphragm) and a region located above the upper surface of the silicon substrate (second diaphragm). A fixed electrode plate is arranged above the first diaphragm, and a low-volume first acoustic sensing portion is formed by the first diaphragm and the fixed electrode plate. Also, a high-volume second acoustic sensing portion is formed by the second diaphragm and the upper surface (electrically conducting layer) of the silicon substrate.

13 Claims, 20 Drawing Sheets

(51) Int. Cl.
*B81B 3/00* (2006.01)
*G10K 11/00* (2006.01)
*H04R 7/06* (2006.01)

(A)

(B)

(A)

(B)

CAPACITANCE TYPE SENSOR, ACOUSTIC SENSOR, AND MICROPHONE

TECHNICAL FIELD

The present invention relates to a capacitive sensor, an acoustic sensor, and a microphone. Specifically, the present invention relates to a capacitive sensor constituted by a capacitor structure that is made up of a vibrating electrode plate (diaphragm) and a fixed electrode plate. The present invention also relates to an acoustic sensor (acoustic transducer) that converts acoustic vibration into an electrical signal and outputs it, and a microphone that uses the acoustic sensor. In particular, the present invention relates to a very small capacitive sensor and acoustic sensor that are produced using MEMS (Micro Electro Mechanical System) technology.

RELATED ART

Electret condenser microphones have conventionally been widely used as compact microphones installed in mobile phones and the like. However, electret condenser microphones are susceptible to heat, and are inferior to MEMS microphones in terms of adaptability to digitalization, size reduction, functionality advancement and multi-functionality, and power saving. For this reason, MEMS microphones have currently become prevalent.

A MEMS microphone includes an acoustic sensor (acoustic transducer) that detects acoustic vibration and converts it into an electrical signal (detection signal), a drive circuit that applies a voltage to the acoustic sensor, and a signal processing circuit that performs signal processing such as amplification on the detection signal from the acoustic sensor and outputs the resulting signal to the outside. The acoustic sensor used in MEMS microphones is a capacitive acoustic sensor manufactured using MEMS technology. Also, the drive circuit and the signal processing circuit are integrally manufactured as an ASIC (Application Specific Integrated Circuit) using semiconductor manufacturing technology.

In recent years, microphones have been required to detect sound from low sound pressures to high sound pressures with high sensitivity. In general, the maximum input sound pressure of a microphone is limited by the harmonic distortion ratio (Total Harmonic Distortion). This is because if a sound with a high sound pressure is to be detected by a microphone, harmonic distortion occurs in the output signal, thus impairing the sound quality and precision. Accordingly, if the harmonic distortion ratio can be reduced, it is possible to increase the maximum input sound pressure and widen the detectable sound pressure range (hereinafter, called the dynamic range) of the microphone.

However, with ordinary microphones, there is a tradeoff relationship between an improvement in acoustic vibration detection sensitivity and a reduction in the harmonic distortion ratio. For this reason, with highly sensitive microphones that can detect low-volume (low sound pressure) sounds, the harmonic distortion ratio of the output signal increases when a high-volume sound enters, and therefore the maximum detectable sound pressure is limited. This is because the output signal of the highly sensitive microphone increases, and harmonic distortion easily occurs. Conversely, when attempting to increase the maximum detectable sound pressure by reducing the harmonic distortion of the output signal, the sensitivity of the microphone degrades, and it is difficult to detect low-volume sounds with high quality. As a result, it has been difficult to give ordinary microphones a wide dynamic range from low-volume (low sound pressure) to high-volume (high sound pressure) sounds.

In light of this technical background, a microphone that employs multiple acoustic sensors having different detection sensitivities has been considered as a method for realizing a microphone that has a wide dynamic range. Microphones of this type are disclosed in Patent Documents 1 to 4, for example.

Patent Documents 1 and 2 disclose a microphone that is provided with multiple acoustic sensors, and switches or combines multiple signals from the acoustic sensors according to the sound pressure. This type of microphone switches between, for example, using a high-sensitivity acoustic sensor having a detectable sound pressure level (SPL) of approximately 30 dB to 115 dB and using a low-sensitivity acoustic sensor having a detectable sound pressure level of approximately 60 dB to 140 dB, thus making it possible to configure a microphone having a detectable sound pressure level of approximately 30 dB to 140 dB. Also, Patent Documents 3 and 4 disclose a microphone in which multiple independent acoustic sensors are formed on one chip.

FIG. 1(A) shows the relationship between the harmonic distortion ratio and sound pressure in the high-sensitivity acoustic sensor of Patent Document 1. FIG. 1(B) shows the relationship between the harmonic distortion ratio and sound pressure in the low-sensitivity acoustic sensor of Patent Document 1. Also, FIG. 2 shows the relationship between the average amount of diaphragm distortion and the sound pressure in the high-sensitivity acoustic sensor and the low-sensitivity acoustic sensor of Patent Document 1. Now, assuming that the permissible harmonic distortion ratio is 20%, the maximum detectable sound pressure of the high-sensitivity acoustic sensor is approximately 115 dB. Also, in the high-sensitivity acoustic sensor, the S/N ratio degrades if the sound pressure is lower than approximately 30 dB, and therefore the minimum detectable sound pressure is approximately 30 dB. Accordingly, the dynamic range of the high-sensitivity acoustic sensor is approximately 30 dB to 115 dB as shown in FIG. 1(A). Similarly, assuming that the permissible harmonic distortion ratio is 20%, the maximum detectable sound pressure of the low-sensitivity acoustic sensor is approximately 140 dB. Also, the area of the diaphragm is smaller in the low-sensitivity acoustic sensor than in the high-sensitivity acoustic sensor, and the average amount of diaphragm distortion is also smaller than in the high-sensitivity acoustic sensor as shown in FIG. 2. Accordingly, the minimum detectable sound pressure of the low-sensitivity acoustic sensor is higher than in the high-sensitivity acoustic sensor, and is approximately 60 dB. As a result, the dynamic range of the low-sensitivity acoustic sensor is approximately 60 dB to 140 dB as shown in FIG. 1(B). If the high-sensitivity acoustic sensor and the low-sensitivity acoustic sensor are combined, the detectable sound pressure range is widened to approximately 30 dB to 140 dB as shown in FIG. 1(C).

Note that the harmonic distortion ratio is defined as follows. The waveform shown by the solid line in FIG. 3(A) is a sine wave of a frequency f1 that serves as the reference. If this reference sine wave is subjected to Fourier transform, spectrum components only appear at frequency f1 positions. Assume that the reference sine wave in FIG. 3(A) has become distorted to the waveform shown by the dashed line in FIG. 3(A) for some sort of reason. Assume that when this distorted waveform is subjected to Fourier transform, the frequency spectrum shown in FIG. 3(B) is obtained. In other words, assume that the distorted waveform has FFT intensities (Fast Fourier Transform intensities) V1, V2, . . . , and V5 at frequencies f1, f2, . . . , and f5. At this time, the harmonic distortion ratio THD of the distorted waveform is defined by Expression 1 below.

[Expression 1]

$$THD = \frac{\sqrt{V2^2 + V3^2 + V4^2 + V5^2}}{V1} \quad \text{(Expression 1)}$$

RELATED ART DOCUMENTS

Patent Documents

Patent Document 1: US Patent Application No. 2009/0316916, Specification
Patent Document 2: US Patent Application No. 2010/0183167, Specification
Patent Document 3: JP 2008-245267A
Patent Document 4: US Patent Application No. 2007/0047746, Specification

SUMMARY OF THE INVENTION

Problem to be Solved by the Invention

However, in the microphones described in Patent Documents 1 to 4, regardless of whether multiple acoustic sensors are formed on separate chips, or multiple acoustic sensors are integrally formed on one chip (substrate), the acoustic sensors have capacitor structures that are independent from each other. For this reason, acoustic characteristic variation and mismatching occur among these microphones. Here, acoustic characteristic variation refers to deviation in acoustic characteristics between acoustic sensors among chips. Also, acoustic characteristic mismatching refers to deviation in acoustic characteristics between acoustic sensors in the same chip.

Specifically, in the case where acoustic sensors are formed on separate chips, inter-chip variation occurs with respect to detection sensitivity due to, for example, variation in the warping and thickness of the produced diaphragms. As a result, there is an increase in the amount of inter-chip variation with respect to the difference in detection sensitivity between acoustic sensors. Also, even in the case where independent acoustic sensors are integrally formed on a common chip, when the capacitor structures of the acoustic sensors are produced using MEMS technology, variation easily occurs in the gap distance between the diaphragm and the fixed electrode. Furthermore, the back chamber and the vent hole are formed separately, and therefore the intra-chip mismatching occurs with acoustic characteristics that are influenced by the back chamber and the vent hole, such as the frequency characteristic and phase.

The present invention was achieved in light of the aforementioned technical issues, and an object thereof is to provide a capacitive sensor and an acoustic sensor that have a wide dynamic range and little mismatching between sensing portions due to forming multiple sensing portions having different sensitivities in an integrated manner, and that enable size reduction and noise reduction.

Means for Solving the Problems

A capacitive sensor according to the present invention is a capacitive sensor that includes: a substrate having a cavity that is open at least at an upper surface; a vibrating electrode plate formed above the substrate so as to cover an upper portion of the cavity; a back plate formed above the substrate so as to cover the vibrating electrode plate; and a fixed electrode plate provided on the back plate, wherein the vibrating electrode plate is divided into a region located above the cavity and a region located above an upper surface of the substrate, a first sensing portion is formed by the fixed electrode plate and the region of the vibrating electrode plate located above the cavity, and a second sensing portion is formed by the upper surface of the substrate and the region of the vibrating electrode plate located above the upper surface of the substrate.

The region of the vibrating electrode plate that constitutes the first sensing portion (i.e., the region located above the cavity) and the region of the vibrating electrode plate that constitutes the second sensing portion (i.e., the region located above the upper surface of the substrate) are divided by a slit formed in the vibrating electrode plate, for example. Also, in order for the upper surface of the substrate to become an electrode of the second sensing portion, the upper surface of the substrate may be subjected to electrical conductivity processing by ion injection or the like, or a substrate electrode may be formed on the upper surface of the substrate in opposition to the region of the vibrating electrode plate that constitutes the second sensing portion.

According to the capacitive sensor of the present invention, the vibrating electrode plate is divided, and therefore multiple sensing portions (a variable capacitor structure) are formed between the vibrating electrode plate and the fixed electrode plate. Accordingly, electrical signals are output from the respective divided sensing portions, and change in pressure such as acoustic vibration can be converted into multiple electrical signals that are then output. According to this capacitive sensor, the sensing portions can be given different detection ranges and sensitivities by, for example, giving each vibrating electrode plate a different area or giving each vibrating electrode plate a different amount of displacement, and the detection range can be widened without reducing the sensitivity, by switching or combining the signals.

Also, the sensing portions are formed by dividing the vibrating electrode plate or the fixed electrode plate that is produced at a single time, and therefore the variation in characteristics between sensing portions is lower than in conventional technology in which the sensing portions are independent from each other and produced separately. As a result, it is possible to reduce variation in characteristics caused by differences in detection sensitivities between the sensing portions. Also, the vibrating electrode plate and the fixed electrode plate are used in common for the sensing portions, and therefore it is possible to reduce mismatching regarding characteristics such as the phase and the frequency characteristics.

Also, in the capacitive sensor of the present invention, the second sensing portion is arranged so as to surround the first sensing portion, and therefore the size of the capacitive sensor can be reduced compared to the case where the first sensing portion and the second sensing portion are arranged side-by-side.

In an embodiment of the capacitive sensor according to the present invention, in a view from above the substrate, the fixed electrode plate is formed at a position that is not overlapped with a region of the vibrating electrode plate that constitutes the second sensing portion. According to this embodiment, it is possible to reduce the parasitic capacitance between the fixed electrode plate and the region of the vibrating electrode plate that constitutes the second sensing portion.

In another embodiment of the capacitive sensor according to the present invention, the vibrating electrode plate is divided into a region that constitutes the first sensing portion and a region that constitutes the second sensing portion, at a position shifted toward an interior of the cavity relative to an edge of an upper opening of the cavity. According to this embodiment, it is possible to reduce the parasitic capacitance between the region of the vibrating electrode plate that constitutes the first sensing portion and the upper surface of the substrate. Also, it is less likely to be influenced by the Brownian motion of air molecules between the region that constitutes the first sensing portion and the substrate upper surface, thus reducing noise in the signal from the first sensing portion.

In yet another embodiment of the capacitive sensor according to the present invention, a region of the vibrating electrode plate that constitutes the first sensing portion and a region of the vibrating electrode plate that constitutes the second sensing portion are partially continuous. According to this embodiment, the first sensing portion and the second sensing portion are electrically connected, and therefore the electrical wiring of the capacitive sensor is simplified. Also, if the vibrating electrode plate is supported by a fixing portion at the location where the first sensing portion and the second sensing portion are connected, the first sensing portion and the second sensing portion can be supported at the same time.

In still another embodiment of the capacitive sensor according to the present invention, a lower surface of an outer peripheral edge of a region of the vibrating electrode plate that constitutes the second sensing portion is supported by a fixing portion provided on the upper surface of the substrate. According to this embodiment, the second sensing portion can be reliably supported, and therefore it is possible to maintain independence between the vibration of the region of the vibrating electrode plate that constitutes the first sensing portion and the region of the vibrating electrode plate that constitutes the second sensing portion, and it is possible to prevent interference between signals from the first sensing portion and the second sensing portion.

In still another embodiment of the capacitive sensor according to the present invention, the area of a region of the vibrating electrode plate that constitutes the second sensing portion is smaller than the area of a region of the vibrating electrode plate that constitutes the first sensing portion. According to this embodiment, the first sensing portion is a high-sensitivity sensing portion, and the second sensing portion is a low-sensitivity sensing portion.

In still another embodiment of the capacitive sensor according to the present invention, a region of the vibrating electrode plate that constitutes the second sensing portion is further divided into a region that has a comparatively large area and a region that has a comparatively small area. According to this embodiment, it is possible to further widen the dynamic range of the capacitive sensor.

An acoustic sensor according to the present invention is an acoustic sensor employing the capacitive sensor according to the present invention, wherein a plurality of holes for allowing passage of acoustic vibration is formed in the back plate and the fixed electrode plate, and signals of different sensitivities are output from the first sensing portion and the second sensing.

With an acoustic sensor that has multiple sensing portions by using a common thin film and dividing an electrode, if acoustic vibration with a high sound pressure is applied, it is likely that the vibrating electrode plate in the high-sensitivity first sensing portion will collide with the back plate and distortion vibration will be generated. However, the second sensing portion of the acoustic sensor of the present invention has a structure that is not likely to be influenced by distortion vibration of the back plate, and therefore it is possible to prevent an increase in harmonic distortion in the second sensing portion on the low sensitivity side caused by distortion vibration generated on the high sensitivity side, and it is possible to prevent the dynamic range of the acoustic sensor from becoming narrow.

A microphone according to the present invention includes an acoustic sensor of the present invention and a circuit portion that amplifies a signal from the acoustic sensor and outputs the amplified signal to the outside. With the microphone of the present invention, it is possible to prevent an increase in harmonic distortion in the second sensing portion on the low sensitivity side caused by distortion vibration generated on the high sensitivity side, and it is possible to prevent the dynamic range of the microphone from becoming narrow.

In an embodiment of the microphone according to the present invention, the circuit portion includes a phase inversion circuit that inverts the phase of one output signal out of an output signal from the first sensing portion and an output signal from the second sensing portion. With an acoustic sensor (capacitive sensor) having the structure of the present invention, the signal phase is inverted between the signal output from the first sensing portion and the signal output from the second sensing portion. However, with this embodiment, it is possible to invert the phase of one output signal out of the output signal from the first sensing portion and the output signal from the second sensing portion with the phase inversion circuit, and therefore the output signal from the first sensing portion and the output signal from the second sensing portion can be handled with the same phase in the circuit portion.

Note that the solution to the problems in the present invention features an appropriate combination of the above-described constituent elements, and many variations of the present invention are possible according to the combination of the constituent elements.

Figure 1:
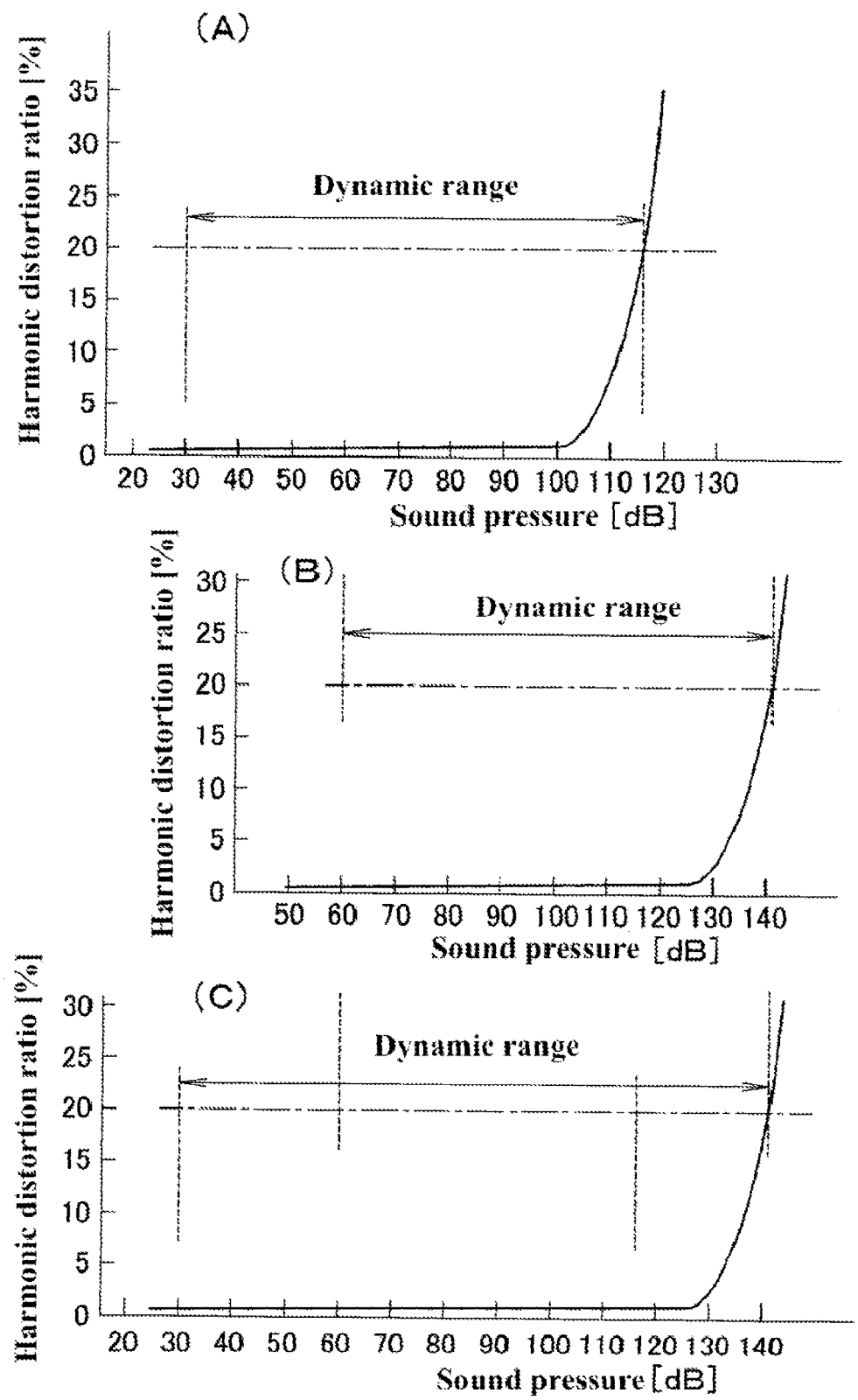
FIG. 1(A) is a diagram showing a relationship between harmonic distortion ratio and sound pressure in a high-sensitivity acoustic sensor of Patent Document 1.
FIG. 1(B) is a diagram showing a relationship between harmonic distortion ratio and sound pressure in a low-sensitivity acoustic sensor of Patent Document 1.
FIG. 1(C) is a diagram showing a relationship between harmonic distortion ratio and sound pressure in the case of combining the high-sensitivity acoustic sensor and the low-sensitivity acoustic sensor of Patent Document 1.
Figure 2:
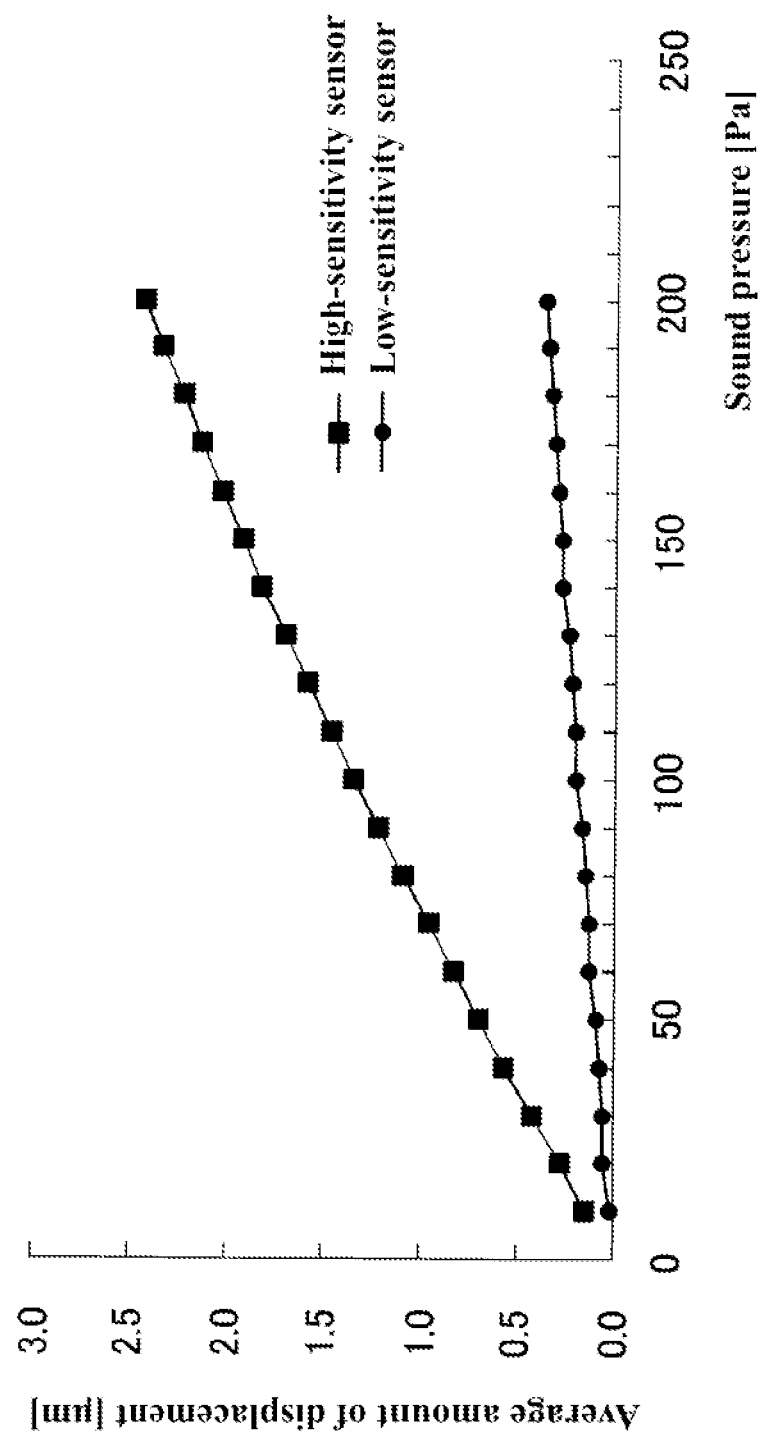
FIG. 2 is a diagram showing a relationship between average amount of diaphragm distortion and sound pressure in the high-sensitivity acoustic sensor and the low-sensitivity acoustic sensor of Patent Document 1.
Figure 3:
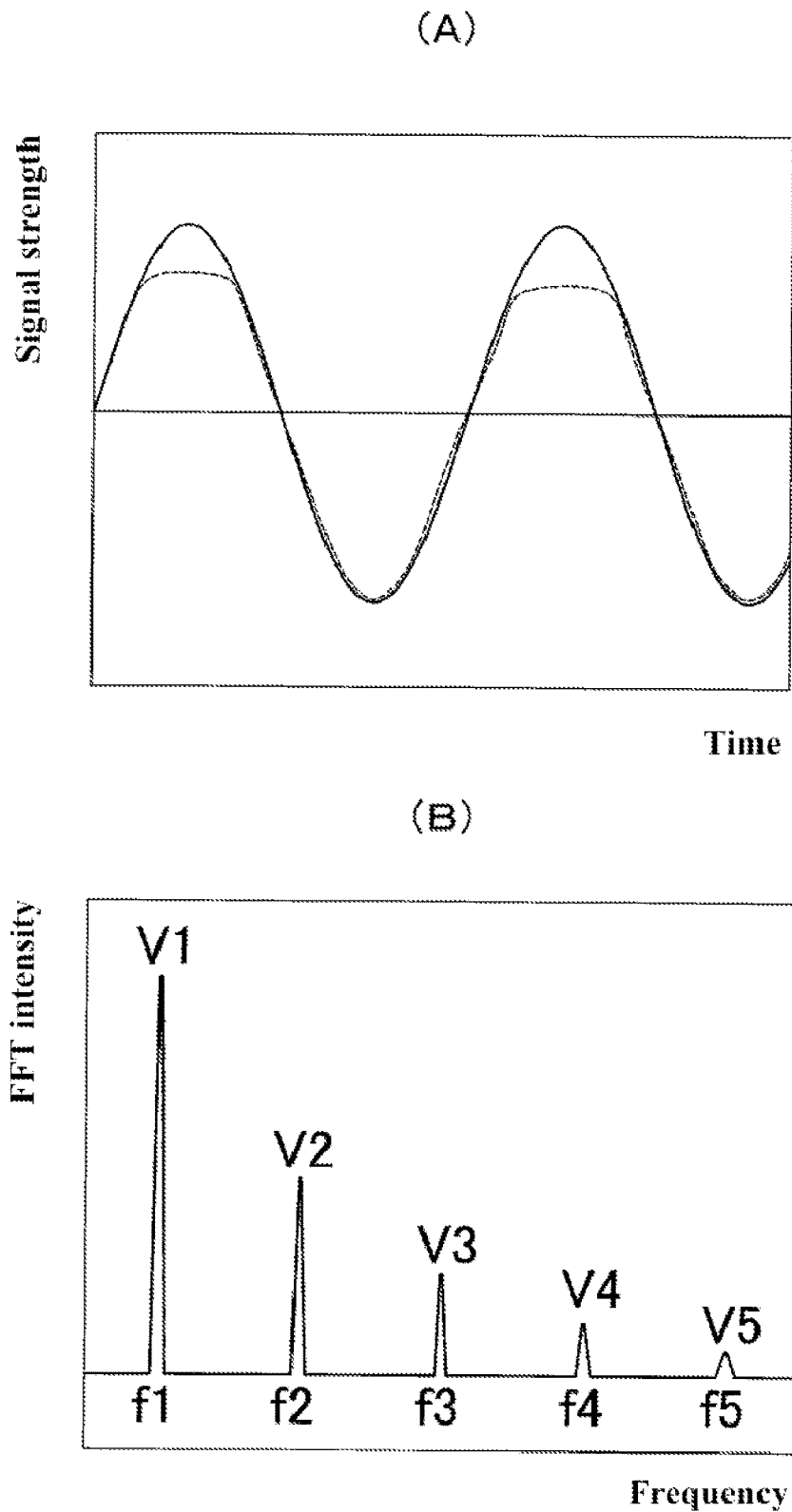
FIG. 3(A) is a diagram showing a reference waveform and a waveform that includes distortion.
FIG. 3(B) is a frequency spectrum diagram of a waveform shown in FIG. 3(A).

INDEX TO THE REFERENCE NUMERALS 11, 71, 74, 76, 81 Acoustic sensor
12 Silicon substrate
13 Diaphragm
13a First diaphragm
13b Second diaphragm
15 Chamber
16, 82 Anchor
17 Slit
18 Back plate
19 Fixed electrode plate
21 Electrically conducting layer
23a First acoustic sensing portion
23b Second acoustic sensing portion
24 Acoustic hole
41 Microphone
44 Signal processing circuit
45 Sound introduction hole
59 Phase inversion circuit

EMBODIMENTS OF THE INVENTION

Hereinafter, preferred embodiments of the present invention will be described with reference to the accompanying drawings. Note that the present invention is not limited to the following embodiments, and various design modifications can be made without departing from the gist of the present invention. Although the following description takes the example of an acoustic sensor and a microphone in particular, besides an acoustic sensor, the present invention is also applicable to a capacitive sensor such as a pressure sensor.

Configuration of Embodiment 1

Figure 4:
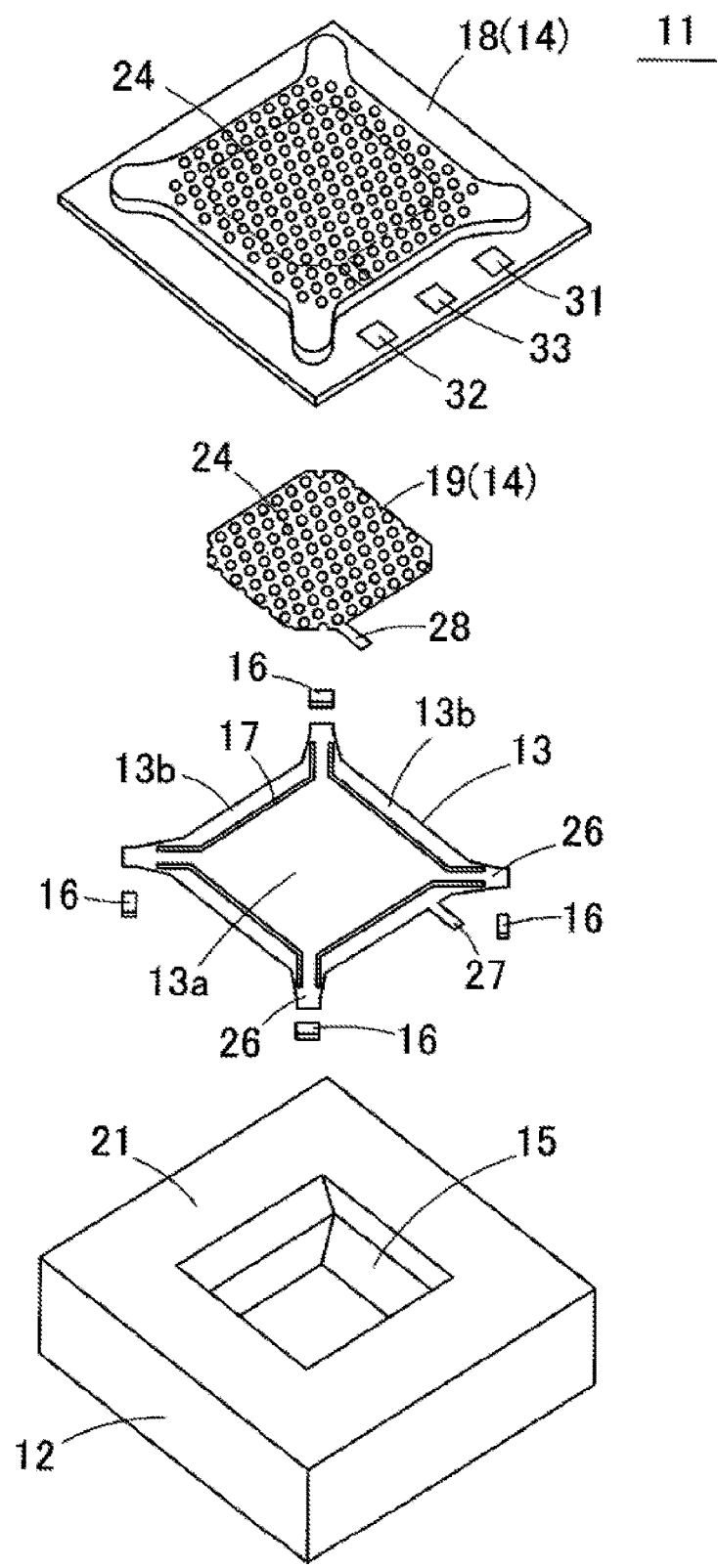
FIG. 4 is an exploded perspective view of an acoustic sensor according to Embodiment 1 of the present invention.
Figure 5:
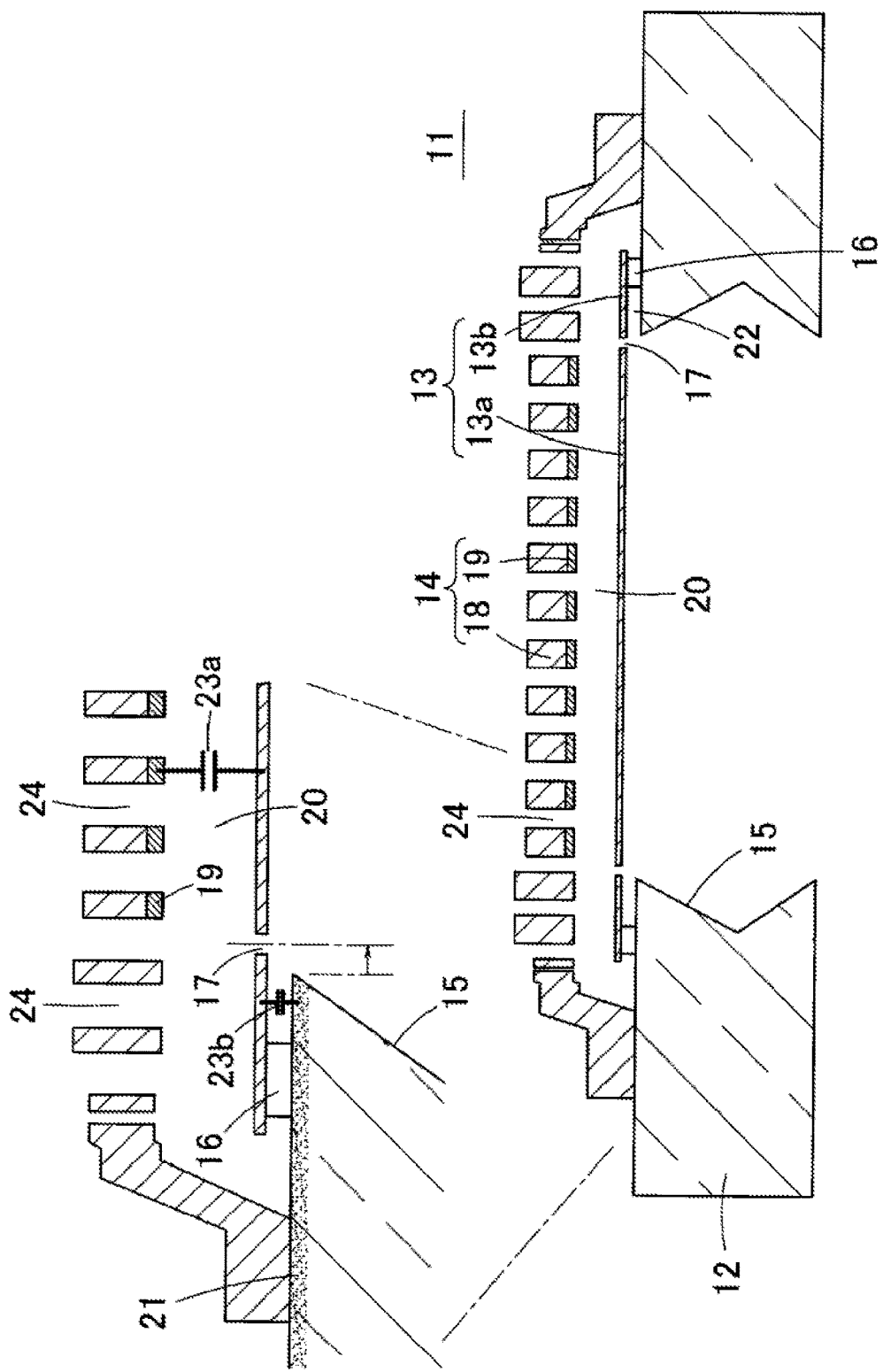
FIG. 5 is a cross-sectional diagram of the acoustic sensor according to Embodiment 1 of the present invention.
Figure 6:
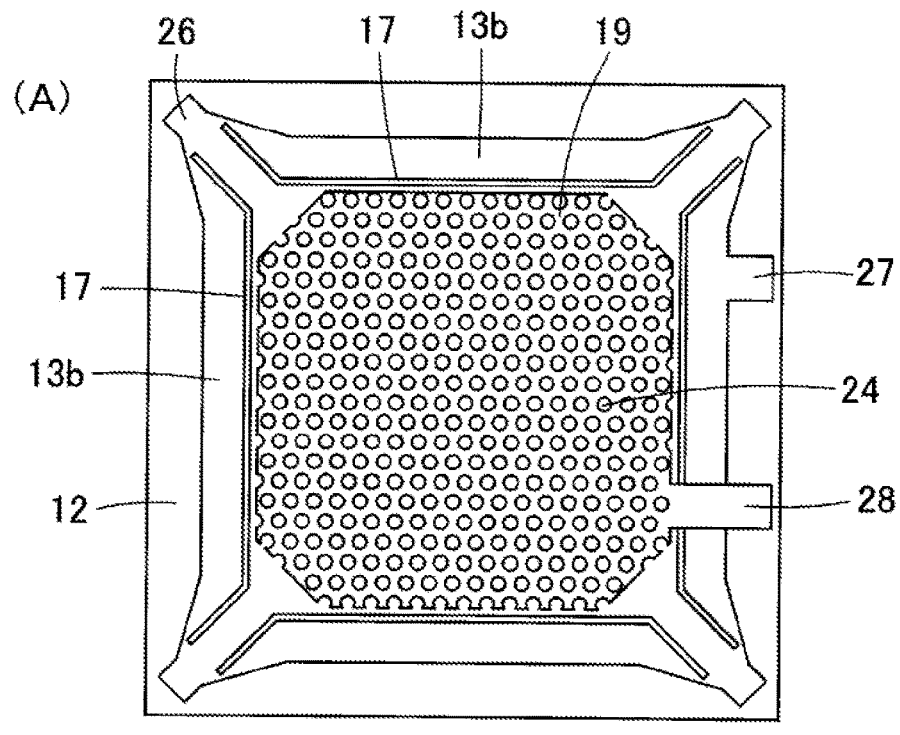
FIG. 6(A) is a plan view showing a state in which a back plate has been removed from the acoustic sensor according to Embodiment 1 of the present invention.
FIG. 6(B) is a plan view showing a state in which the back plate and a fixed electrode plate have been removed from the acoustic sensor according to Embodiment 1 of the present invention.
Figure 6:
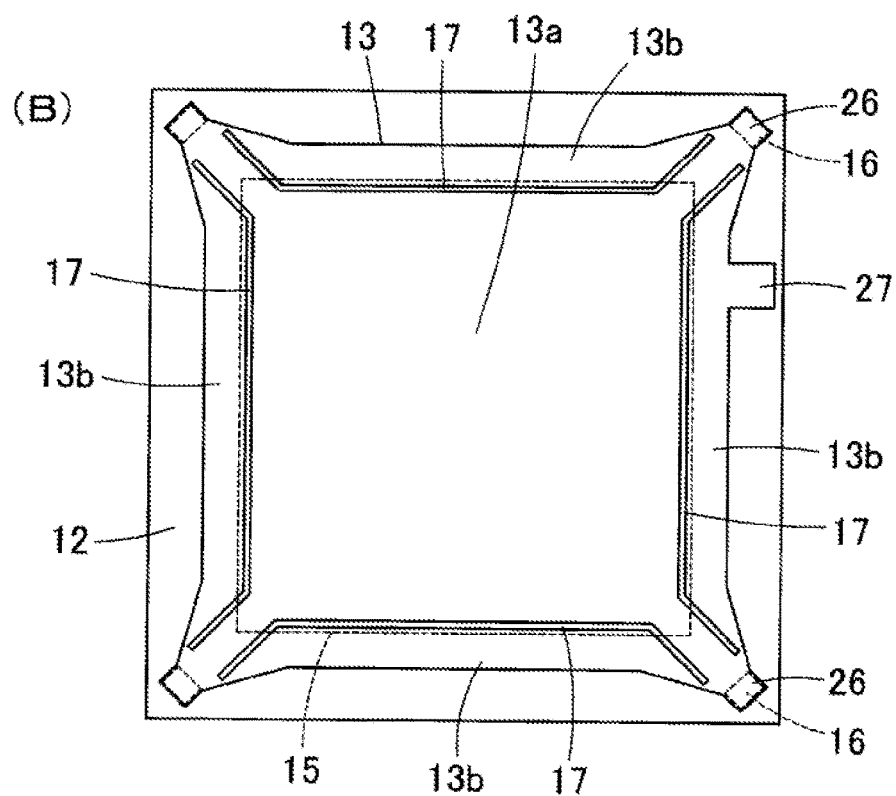

Hereinafter, the structure of an acoustic sensor according to Embodiment 1 of the present invention will be described with reference to FIGS. 4 to 6. FIG. 4 is an exploded perspective view of an acoustic sensor 11 according to Embodiment 1 of the present invention. FIG. 5 is a cross-sectional diagram of the acoustic sensor 11, and also shows an enlargement of one portion. FIG. 6(A) is a plan view of the acoustic sensor 11 from which a back plate 18 has been removed, and shows how a diaphragm 13 (vibrating electrode plate) and a fixed electrode plate 19 are overlapped above a silicon substrate 12 (substrate). FIG. 6(B) is a plan view of the acoustic sensor 11 from which the back plate 18 and the fixed electrode plate 19 have been removed, and shows the arrangement of the diaphragm 13 on the upper surface of the silicon substrate 12.

This acoustic sensor 11 is a capacitive element manufactured using MEMS technology. As shown in FIGS. 4 and 5, this acoustic sensor 11 includes the diaphragm 13 provided on the upper surface of the silicon substrate 12 (substrate) via anchors 16 (fixing portions), and a canopy portion 14 that is arranged above the diaphragm 13 via a very small air gap 20 (air gap) and is fixed to the upper surface of the silicon substrate 12.

A chamber 15 (cavity) that penetrates from the upper surface to the lower surface is formed in the silicon substrate 12, which is made of single crystal silicon. The chamber 15 shown in the figures is constituted by wall surfaces that are inclined surfaces formed by (100) surfaces, (111) surfaces of the silicon substrate, and surfaces equivalent to the (111) surfaces, but the wall surfaces of the chamber 15 may be vertical surfaces. Also, the upper surface of the silicon substrate 12 has been given electrical conductivity by ion injection, and serves as an electrically conducting layer 21.

The electrically conducting layer 21 is connected to an electrode pad 33 provided on the upper surface of the back plate 18.

In this way, if the electrically conducting layer 21 is formed on the upper surface of the silicon substrate 12 by ion injection and used as a substrate-side electrode for a later-described second acoustic sensing portion 23b, there is no need to lay wiring as in the case of forming a wiring pattern by metal films on the upper surface of the silicon substrate 12, and the process for producing the acoustic sensor 11 can be simplified.

The diaphragm 13 is arranged on the upper surface of the silicon substrate 12 so as to cover the upper opening of the chamber 15. As shown in FIGS. 4 and 6(B), the diaphragm 13 is formed with an approximately rectangular shape. The diaphragm 13 is formed by an electrically conductive polysilicon thin film, and the diaphragm 13 itself is a vibrating electrode plate. The diaphragm 13 is produced at one time and as a single body, and is then divided into two regions by slits 17 that extend approximately parallel with the outer peripheral sides. Note that the diaphragm 13 is not completely divided into two by the slits 17, and is mechanically and electrically connected in the vicinity of the end portions of the slits 17 (in the corner portions of the diaphragm 13). In the following, out of the two regions divided by the slits 17, the approximately rectangular region that is located in the central portion and has a large area is called a first diaphragm 13a (the region that constitutes the first sensing portion of the vibrating electrode plate), and the region formed so as to surround the first diaphragm 13a is called the second diaphragm 13b (the region that constitutes the second sensing portion of the vibrating electrode plate).

It is possible to completely mechanically and electrically separate the first diaphragm 13a and the second diaphragm 13b from each other, or the second diaphragms 13b of respective sides from each other, but in this case, the portions each need to be supported by an anchor, and the portions each need to be connected a wiring pattern. For this reason, in the present embodiment, the first diaphragm 13a and the second diaphragm 13b are separated by the slits 17 while also being connected in the corner portions, thus simplifying the support structure and eliminating the need for connections by a wiring pattern.

Leg pieces 26 provided in the corner portions of the diaphragm 13, that is to say the first diaphragm 13a and the second diaphragm 13b, are supported by anchors 16 on the upper surface of the silicon substrate 12, and the diaphragm 13 is supported so as to float above the upper opening of the chamber 15 and the upper surface of the silicon substrate 12. Also, a lead-out interconnect 27 is drawn from the diaphragm 13, and the lead-out interconnect 27 is connected to an electrode pad 31 provided on the upper surface of the back plate 18.

As shown in FIG. 5, the canopy portion 14 is obtained by providing a fixed electrode plate 19 made of polysilicon on the lower surface of the back plate 18 made of SiN. The canopy portion 14 is formed with a dome shape and has a cavity portion underneath the dome, and the diaphragm 13 is covered by the cavity portion. A very small air gap 20 (air gap) is formed between the lower surface of the canopy portion 14 (i.e., the lower surface of the fixed electrode plate 19) and the upper surface of the diaphragm 13. Also, a lead-out interconnect 28 is drawn from the fixed electrode plate 19, and the lead-out interconnect 28 is connected to an electrode pad 32 provided on the upper surface of the back plate 18.

Many acoustic holes 24 (acoustic holes) for allowing the passage of acoustic vibration are formed in the canopy portion 14 (i.e., the back plate 18 and the fixed electrode plate 19) so as to penetrate from the upper surface to the lower surface. As shown in FIGS. 4 and 6(A), the acoustic holes 24 are arranged regularly. In the illustrated example, the acoustic holes 24 are arranged in a triangular manner along three directions that form 120° angles with each other, but they may be arranged in a rectangular manner or a concentric circle manner.

In this acoustic sensor 11, the fixed electrode plate 19 and the first diaphragm 13a oppose each other via the air gap 20 so as to constitute a capacitor structure, and form a first acoustic sensing portion 23a (first sensing portion). Similarly, the second diaphragm 13b and the surface of the silicon substrate 12 (the electrically conducting layer 21) oppose each other via the air gap 22 so as to constitute a capacitor structure, and form a second acoustic sensing portion 23b (second sensing portion).

Figure 7:
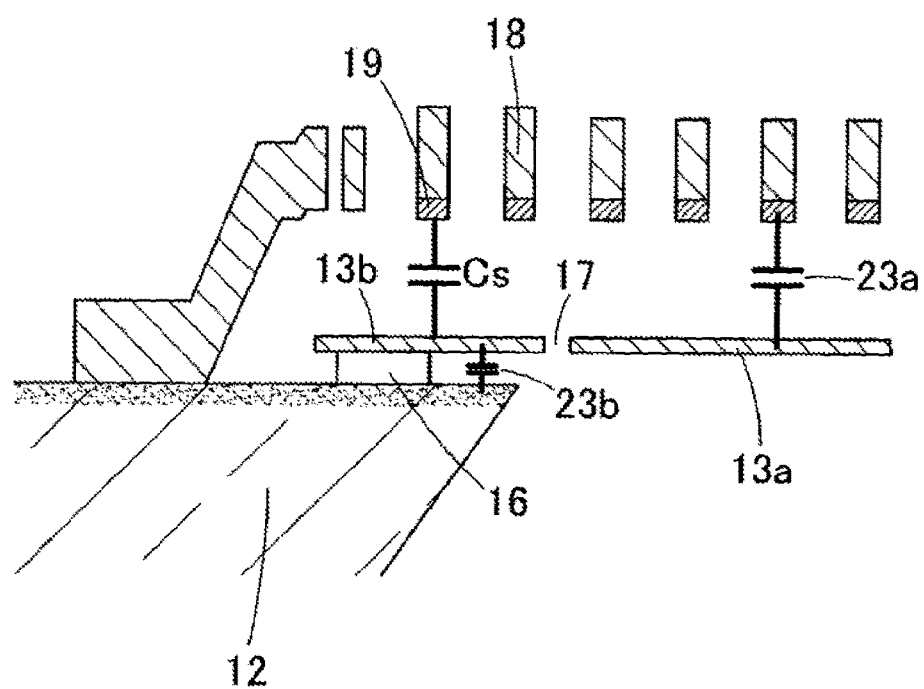
FIG. 7 is a schematic cross-sectional diagram showing a comparative example in which the fixed electrode plate is provided at a position that opposes a second diaphragm as well.

Here, as shown in FIGS. 5 and 6(A), the fixed electrode plate 19 is provided in a region that opposes the first diaphragm 13a, and the fixed electrode plate 19 is arranged so as to not be overlapped with the second diaphragm 13b in a view from a direction perpendicular to the upper surface of the silicon substrate 12. If the fixed electrode plate 19 is provided at a position opposing the second diaphragm 13b as well as in the comparison example shown in FIG. 7, a parasitic capacitance Cs is generated between the fixed electrode plate 19 and the second diaphragm 13b, and the signal from the first acoustic sensing portion 23a and the signal from the second acoustic sensing portion 23b interfere with each other. In contrast, if the fixed electrode plate 19 is provided at only the position opposing the first diaphragm 13a as in the present embodiment, it is possible to reduce the parasitic capacitance between the fixed electrode plate 19 and the second diaphragm 13b and prevent the signals from the first acoustic sensing portion 23a and the second acoustic sensing portion 23b from interfering with each other.

Also, as shown in FIGS. 5 and 6(B), the slits 17 are shifted toward the interior of the chamber 15 relative to the edge of the upper opening of the chamber 15, with the exception of the two end portions.

Operation of Embodiment 1

In the acoustic sensor 11, when acoustic vibration enters the chamber 15 (front chamber), the diaphragms 13a and 13b, which are thin-films, vibrate with the same phase due to the acoustic vibration. When the diaphragms 13a and 13b vibrate, the capacitances of the acoustic sensing portions 23a and 23b change. As a result, in the first acoustic sensing portion 23a, the acoustic vibration (change in sound pressure) detected by the first diaphragm 13a is change in the capacitance between the first diaphragm 13a and the fixed electrode plate 19, and this is output as an electrical signal. Also, in the second acoustic sensing portion 23b, the acoustic vibration (change in sound pressure) detected by the second diaphragm 13b is change in the capacitance between the second diaphragm 13b and the electrically conducting layer 21 of the silicon substrate 12, and this is output as an electrical signal. Also, in a different use mode, such as a use mode in which the chamber 15 is the back chamber, acoustic vibration enters the air gap 20 in the canopy portion 14 through the acoustic holes 24 and causes the diaphragms 13a and 13b, which are thin films, to vibrate.

Also, since the area of the second diaphragm 13b is smaller than the area of the first diaphragm 13a, the second acoustic sensing portion 23b is a low-sensitivity acoustic sensor for the sound pressure range from mid-volume to high-volume, and the first acoustic sensing portion 23a is a high-sensitivity acoustic sensor for the sound pressure range from low-volume to mid-volume. Accordingly, the dynamic range of the acoustic sensor 11 can be widened by obtaining a hybrid form for the two acoustic sensing portions 23a and 23b and outputting signals from a later-described processing circuit. For example, assuming that the dynamic range of the first acoustic sensing portion 23a is approximately 30 to 120 dB, and that the dynamic range of the second sensing portion 23b is approximately 50 to 140 dB, combining these two acoustic sensing portions 23a and 23b makes it possible to widen the dynamic range to approximately 30 to 140 dB. Also, if the output of the acoustic sensor 11 is switched between the first acoustic sensing portion 23a for low-volume to mid-volume and the second acoustic sensing portion 23b for mid-volume to high-volume, it is possible to not use output from the first acoustic sensing portion 23a when the volume is high. As a result, even if harmonic distortion increases in the high sound pressure range in the first acoustic sensing portion 23a, the signal from it is not output from the acoustic sensor 11, and thus does not influence the performance of the acoustic sensor 11. Consequently, it is possible to raise the sensitivity of the first acoustic sensing portion 23a with respect to low-volume.

Furthermore, in this acoustic sensor 11, the first acoustic sensing portion 23a and the second acoustic sensing portion 23b are formed on the same substrate. Moreover, the first acoustic sensing portion 23a and the second acoustic sensing portion 23b use the first diaphragm 13a and the second diaphragm 13b that are obtained by using the slits 17 to divide the diaphragm 13 produced at a single time and as an integrated body. In other words, a sensing portion that is originally one portion is divided into two portions, and the first acoustic sensing portion 23a and the second acoustic sensing portion 23b have a hybrid form. For this reason, compared to a conventional example in which two independent sensing portions are provided on one substrate, and a conventional example in which sensing portions are respectively provided on separate substrates, the first acoustic sensing portion 23a and the second acoustic sensing portion 23b have similar variation regarding detection sensitivity. As a result, variation in detection sensitivity between the two acoustic sensing portions 23a and 23b can be reduced. Also, since one diaphragm is used in common for the two acoustic sensing portions 23a and 23b, it is possible to suppress mismatching regarding acoustic characteristics such as phase and frequency characteristics.

Application in Microphone

FIG. 8(A) is a plan view showing a partial breakaway view of a microphone 41 having the acoustic sensor 11 according to Embodiment 1 built therein, and shows the interior thereof with the upper surface of the cover 43 removed. FIG. 8(B) is a longitudinal sectional view of the microphone 41.

This microphone 41 has the acoustic sensor 11 and a signal processing circuit 44 (ASIC), which is a circuit portion, built into a package made up of a circuit substrate 42 and a cover 43. The acoustic sensor 11 and the signal processing circuit 44 are mounted on the upper surface of the circuit substrate 42. A sound introduction hole 45 for the introduction of acoustic vibration into the acoustic sensor 11 is formed in the circuit substrate 42. The acoustic sensor 11 is mounted on the upper surface of the circuit substrate 42 such that the lower opening of the chamber 15 is aligned with the sound introduction hole 45 and covers the sound introduction hole 45. Accordingly, the chamber 15 of the acoustic sensor 11 is the front chamber, and the space inside the package is the back chamber.

The electrode pads 31, 32, and 33 of the acoustic sensor 11 are connected to pads 47 of the signal processing circuit 44 by respective bonding wires 46. Multiple terminals 48 for electrically connecting the microphone 41 to the outside are provided on the lower surface of the circuit substrate 42, and electrode portions 49 in conduction with the terminals 48 are provided on the upper surface of the circuit substrate 42. Pads 50 of the signal processing circuit 44 mounted on the circuit substrate 42 are connected to the electrode portions 49 by respective bonding wires 51. Note that the pads 50 of the signal processing circuit 44 have a function of supplying electrical power to the acoustic sensor 11 and a function of outputting capacitance change signals from the acoustic sensor 11 to the outside.

The cover 43 is attached to the upper surface of the circuit substrate 42 so as to cover the acoustic sensor 11 and the signal processing circuit 44. The package has an electromagnetic shielding function, and protects the acoustic sensor 11 and the signal processing circuit 44 from mechanical shock and electrical disturbances from the outside.

In this way, acoustic vibration that has entered the chamber 15 through the sound introduction hole 45 is detected by the acoustic sensor 11, and then output after being subjected to amplification and signal processing by the signal processing circuit 44. Since the space inside the package is the back chamber in this microphone 41, the volume of the back chamber can be increased, and the sensitivity of the microphone 41 can be increased.

Note that in this microphone 41, the sound introduction hole 45 for introducing acoustic vibration into the package may be formed in the upper surface of the cover 43. In this case, the chamber 15 of the acoustic sensor 11 is the back chamber, and the space inside the package is the front chamber.

Figure 8:
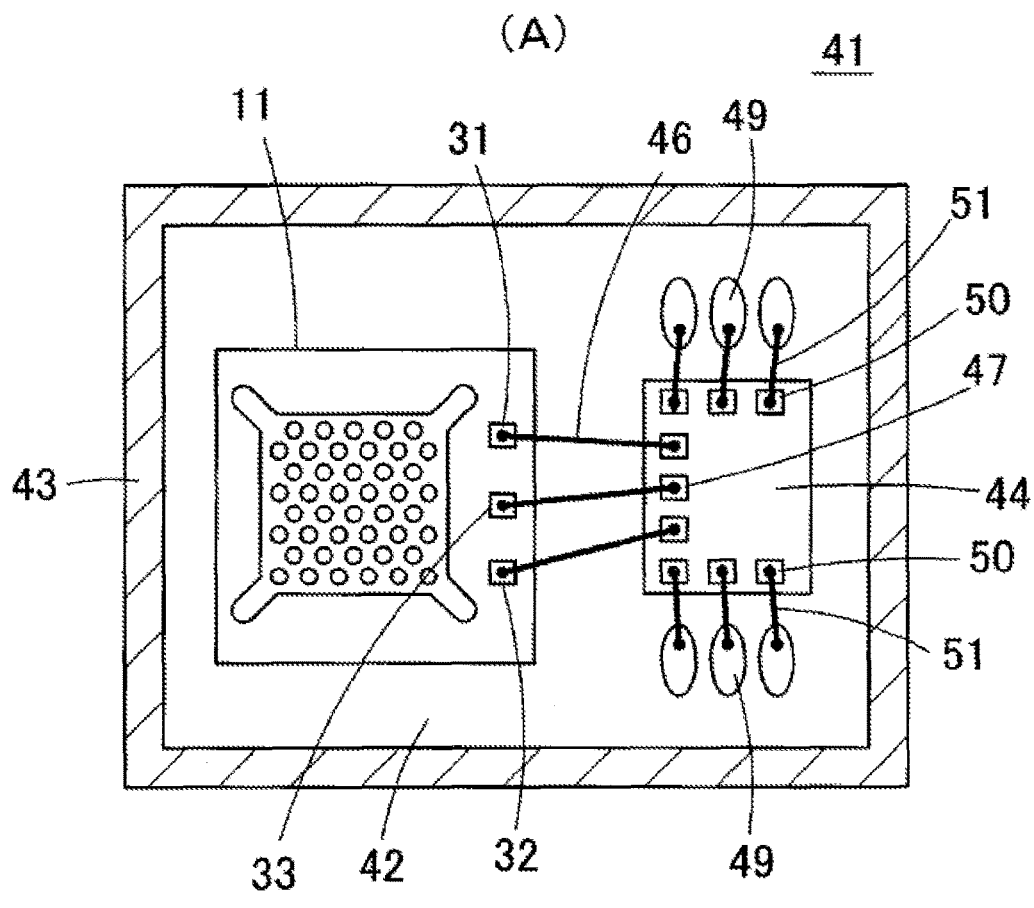
FIG. 8(A) is a plan view showing a partial breakaway view of a microphone in which a signal processing circuit and the acoustic sensor according to Embodiment 1 of the present invention are accommodated in a casing.
FIG. 8(B) is a longitudinal sectional view of the microphone.
Figure 8:
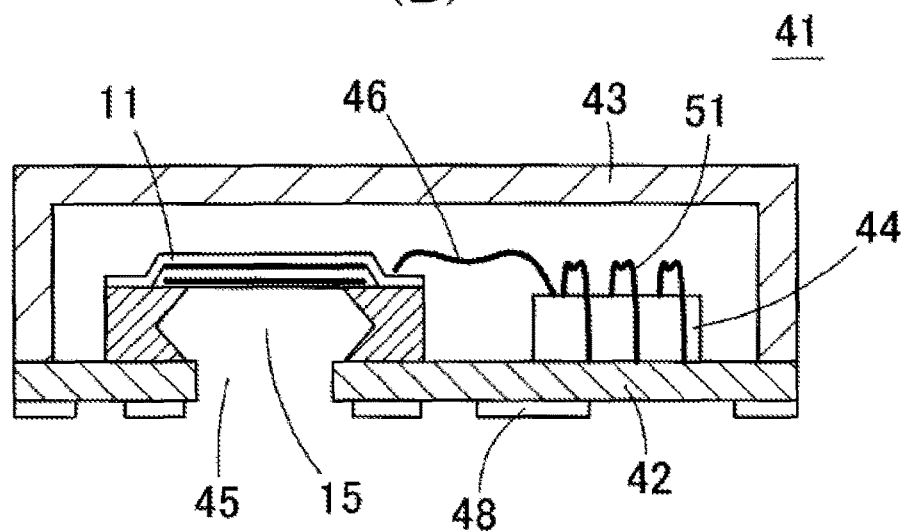
Figure 9:
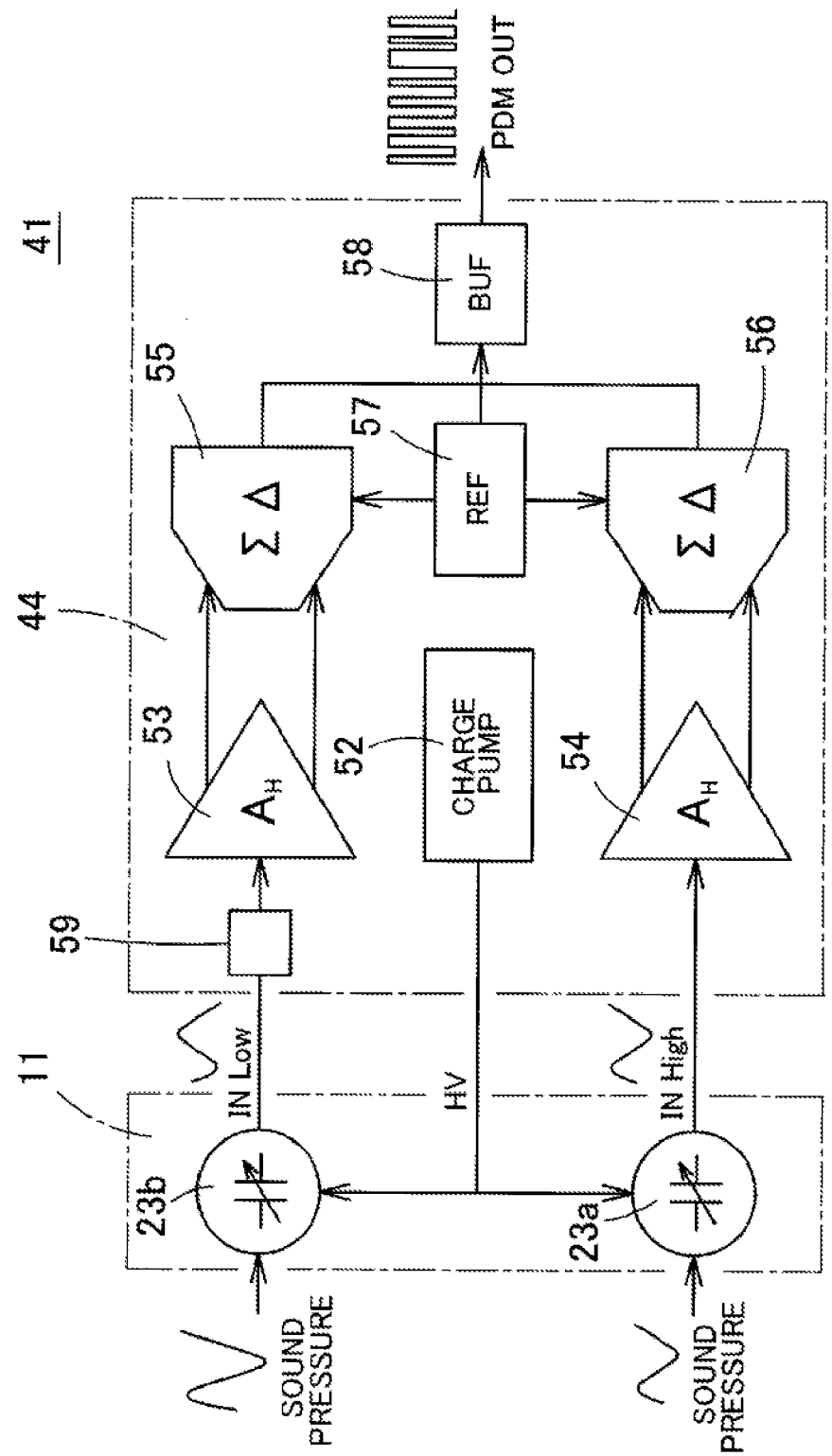
FIG. 9 is a circuit diagram of the microphone according to Embodiment 1 of the present invention.

FIG. 9 is a circuit diagram of the MEMS microphone 41 shown in FIG. 8. As shown in FIG. 9, the acoustic sensor 11 includes the first acoustic sensing portion 23a on the high sensitivity side and the second acoustic sensing portion 23b on the low sensitivity side, whose capacitances change according to acoustic vibration.

Also, the signal processing circuit 44 includes a charge pump 52, a low-sensitivity amplifier 53, a high-sensitivity amplifier 54, $\Sigma\Delta$ ($\Delta\Sigma$) ADCs (Analog-to-Digital Converters) 55 and 56, a reference voltage generator 57, a buffer 58, and a phase inversion circuit 59.

The charge pump 52 applies a high voltage HV to the first acoustic sensing portion 23a and the second acoustic sensing portion 23b, the electrical signal output from the second acoustic sensing portion 23b is amplified by the low-sensitivity amplifier 53, and the electrical signal output from the first acoustic sensing portion 23a is amplified by the high-sensitivity amplifier 54. However, the first acoustic sensing portion 23a outputs the capacitance between the upper surface of the first diaphragm 13a and the fixed electrode plate 19, and the second acoustic sensing portion 23b outputs the capacitance between the lower surface of the second diaphragm 13b and the electrically conducting layer 21. For this reason, if the air gap 20 of the first acoustic sensing portion 23a has become narrow (wide), the air gap 22 of the second acoustic sensing portion 23b becomes wide (narrow), and the phases of the output of the first acoustic sensing portion 23a and the output of the second acoustic sensing portion 23b become inverted (the phases deviate by) 180°. For this reason, the phase of the output of the second acoustic sensing portion 23b is inverted by the phase inversion circuit 59 such that this output is input to the low-sensitivity amplifier 53 in a state of having eliminated the phase difference with the output of the first acoustic sensing portion 23a. Of course, the phase inversion circuit 59 may be inserted between the first acoustic sensing portion 23a and the high-sensitivity amplifier 54.

The signal amplified by the low-sensitivity amplifier 53 is converted into a digital signal by the ΣΔ ADC 55. Similarly, the signal amplified by the high-sensitivity amplifier 54 is converted into a digital signal by the ΣΔ ADC 56. The digital signals obtained by the ΣΔ ADCs 55 and 56 are output to the outside on one data line as a PDM (Pulse Density Modulation) signal via the buffer 58. Although not shown, the digital signals consolidated on the one data line are selected according to the signal strength, and thus the first acoustic sensing portion 23a and the second acoustic sensing portion 23b are automatically switched according to the sound pressure.

Note that although two digital signals obtained by the ΣΔ ADCs 55 and 56 are consolidated and output on one data line in the example of FIG. 9, these two digital signals may be output on separate data lines.

Furthermore, according to this structure of the acoustic sensor 11, the size of the acoustic sensor 11 can be reduced. The Applicant of the present invention has proposed the structure shown in FIG. 10 (e.g., Japanese Patent Application No. 2012-125526) as an acoustic sensor in which two acoustic sensing portions are achieved in a hybrid manner to widen the dynamic range, and mismatching between the acoustic sensing portions and the like are reduced. In an acoustic sensor 61 (reference example) in FIG. 10, a diaphragm 64 provided on the upper surface of a silicon substrate 62 is divided into left and right portions by a slit 63, thus forming a first diaphragm 64a having a large area and a second diaphragm 64b having a small area. A fixed electrode plate 65a having a large area is provided above the first diaphragm 64a and in opposition to the first diaphragm 64a, and a high-sensitivity first acoustic sensing portion 66a is constituted by the first diaphragm 64a and the fixed electrode plate 65a. Similarly, a fixed electrode plate 65b having a small area is provided above the second diaphragm 64b and in opposition to the second diaphragm 64b, and a low-sensitivity second acoustic sensing portion 66b is constituted by the second diaphragm 64b and the fixed electrode plate 65b. With this acoustic sensor 61, the first acoustic sensing portion 66a and the second acoustic sensing portion 66b are aligned side-by-side, and therefore size in a view from above is large, and occupied area in the case of mounting on a interconnect substrate or the like is large.

In contrast, with the acoustic sensor 11 of the present embodiment, the first acoustic sensing portion 23a and the second acoustic sensing portion 23b are constituted in the central portion and the outer peripheral portion, and therefore there is almost no change in size from a conventional acoustic sensor that has a signal acoustic sensing portion. Therefore, according to the acoustic sensor 11 of the present embodiment, it is possible to reduce the sensor size in comparison with the acoustic sensor 61 of the reference example.

Figure 10:
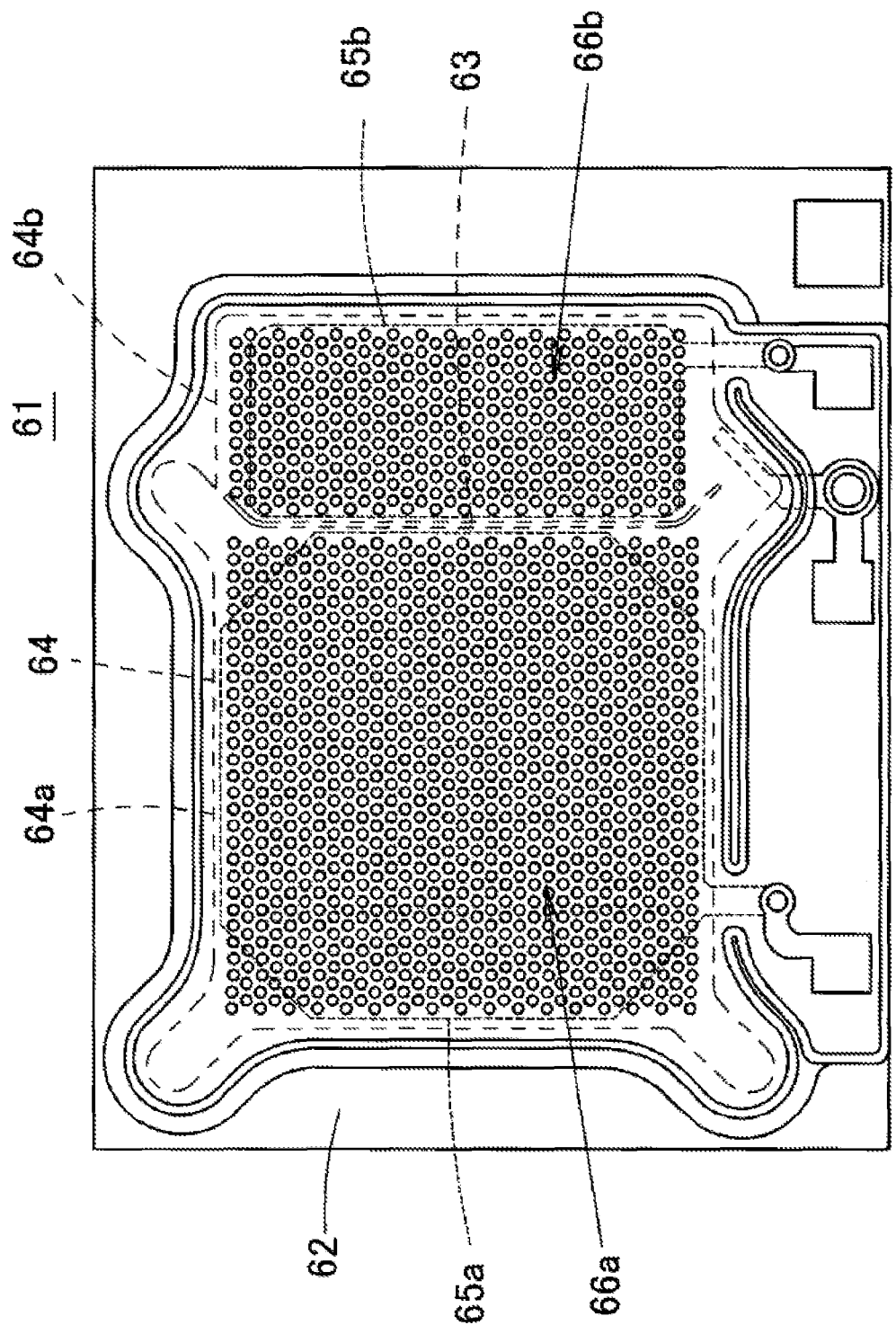
FIG. 10 is a plan view showing an acoustic sensor in a reference example.

Also, with the acoustic sensor 61 shown in FIG. 10, the harmonic distortion of the acoustic sensor on the low sensitivity side increases due to interference between the first acoustic sensing portion 66a on the high sensitivity side (low volume side) and the second acoustic sensing portion 66b on the low sensitivity side (high volume side), and as a result, there is a risk of a decrease in the maximum detectable sound pressure of the acoustic sensor and a narrower dynamic range. According to the acoustic sensor 11 of Embodiment 1 of the present invention, it is possible to prevent this increase in harmonic distortion. The reason for this is as follows.

Figure 11:
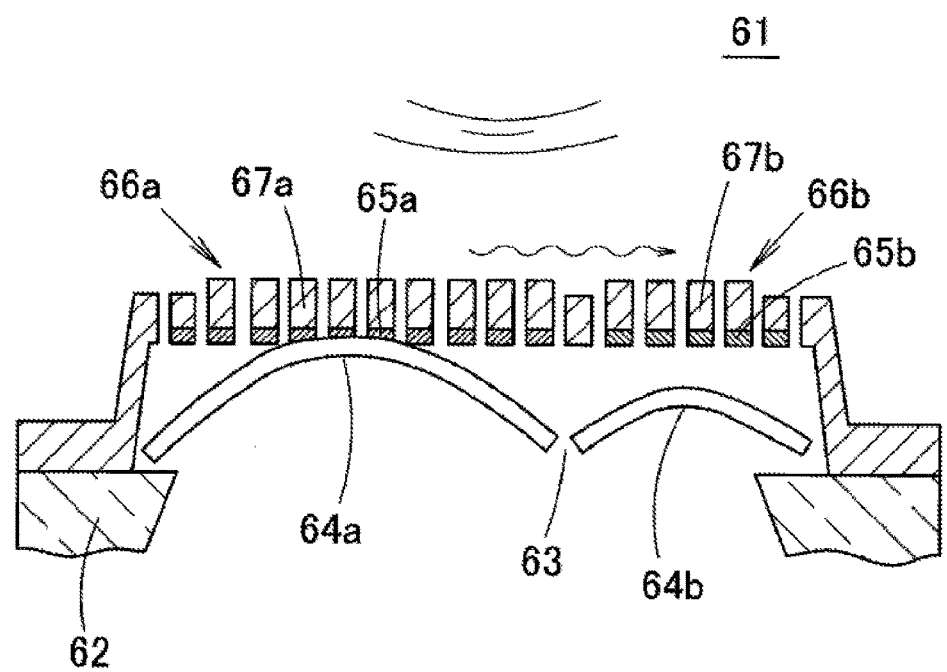
FIG. 11 is a schematic cross-sectional diagram showing how a diaphragm on the high sensitivity side collides with the back plate in the acoustic sensor in the reference example.

First, the case of the acoustic sensor 61 will be described. The first diaphragm 64a on the high sensitivity side has a larger area and is more flexible than the second diaphragm 64b on the low sensitivity side. For this reason, when acoustic vibration with a high sound pressure is applied to the acoustic sensor 61, there are cases where the first diaphragm 64a collides with the back plate 67a as shown in FIG. 11. FIG. 11 shows how the first diaphragm 64a collides with the back plate 67a due to high sound pressure in the acoustic sensor 61.

Figure 12:
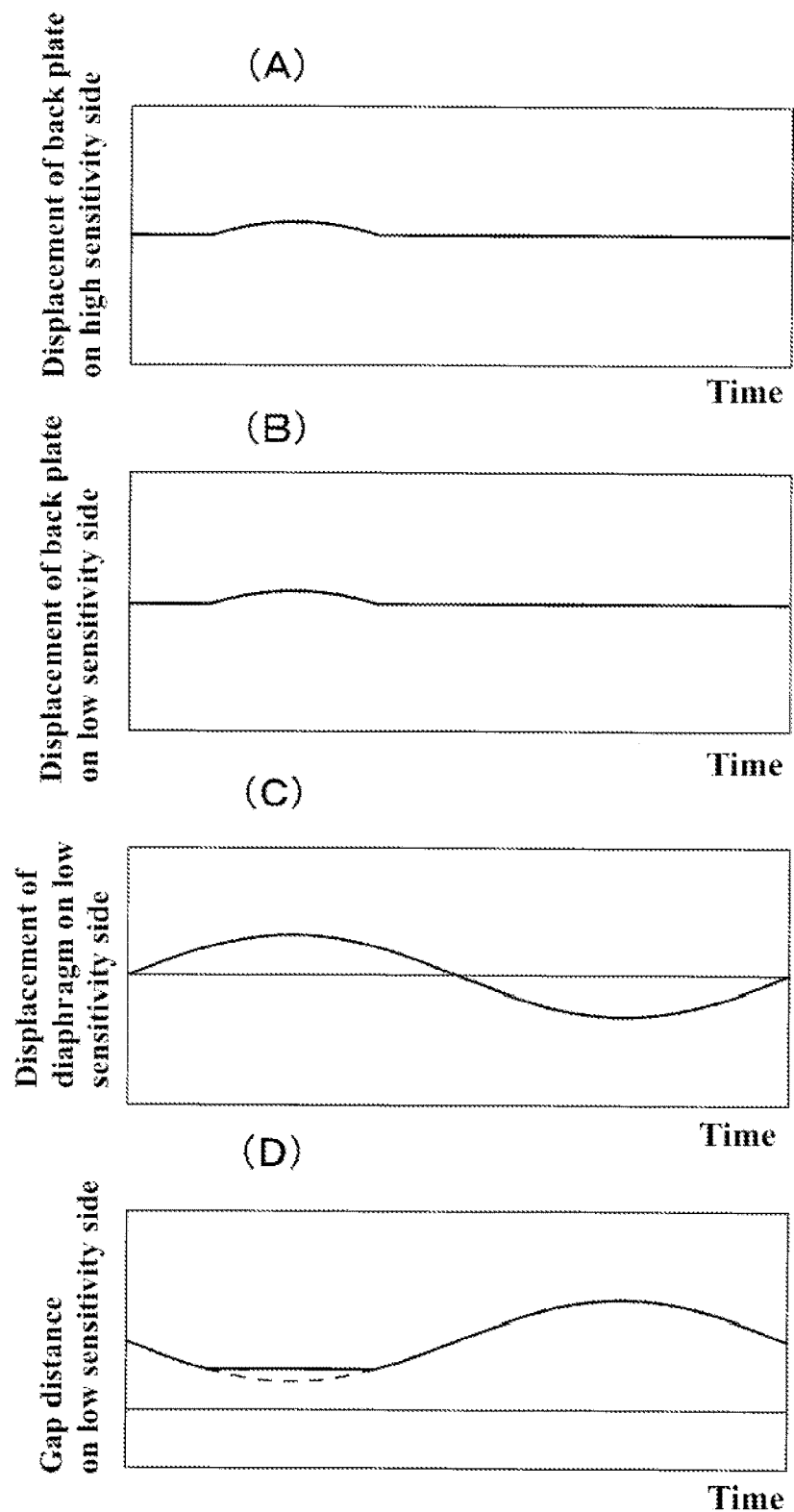
FIG. 12(A) is a diagram showing vibration that occurs in the back plate on the high sensitivity side when the diaphragm on the high sensitivity side collides with the back plate in the acoustic sensor in FIG. 11.
FIG. 12(B) is a diagram showing vibration that propagates to the back plate on the low sensitivity side when the diaphragm on the high sensitivity side collides with the back plate in the acoustic sensor in FIG. 11.
FIG. 12(C) is a diagram showing vibration in the diaphragm on the low sensitivity side.
FIG. 12(D) is a diagram showing change in the gap between the diaphragm on the high sensitivity side and the fixed electrode plate when the diaphragm on the high sensitivity side collides with the back plate in the acoustic sensor in FIG. 11.

If the first diaphragm 64a collides with the back plate 67a as shown in FIG. 11, the vibration of the back plate 67a becomes distorted due to this collision, and distortion vibration occurs as shown in FIG. 12(A). Note that although the back plate also vibrates due to acoustic vibration similarly to the diaphragm, the amplitude of the back plate is around 1/100 the amplitude of the diaphragm, and therefore acoustic vibration is not shown in FIG. 12. The distortion vibration occurring in the back plate 67a is transmitted to the back plate 67b, and therefore the distortion vibration shown in FIG. 12(B) occurs in the back plate 67b as well due to the collision with the first diaphragm 64a. On the other hand, the second diaphragm 64b undergoes less distortion than the first diaphragm 64a, and therefore undergoes sine wave vibration as shown in FIG. 12(C), for example, and does not collide with the back plate 67b. If the distortion vibration of the back plate 67b is added to the sine wave vibration of the second diaphragm 64b, the gap distance between the back plate 67b and the second diaphragm 64b in the second acoustic sensing portion 66b changes as shown in FIG. 12(D). As a result, the output signal from the second acoustic sensing portion 66b becomes distorted, and the harmonic distortion ratio of the second acoustic sensing portion 66b degrades. For this reason, the acoustic sensor 61 needs to have a configuration for preventing the distortion vibration occurring on the first acoustic sensing portion side from being transmitted to the second acoustic sensing portion side.

Figure 13:
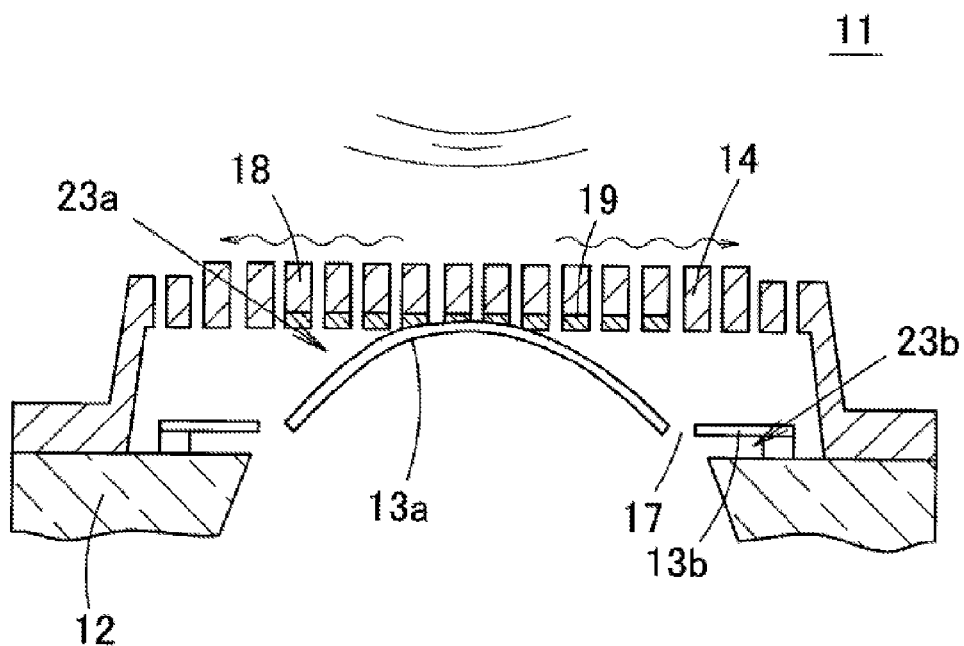
FIG. 13 is a schematic cross-sectional diagram showing how a diaphragm on the high sensitivity (low volume) side collides with the back plate in the acoustic sensor according to Embodiment 1 of the present invention.

In contrast, in the case of the acoustic sensor 11 of Embodiment 1, as shown in FIG. 13, even if distortion vibration occurs due to the first diaphragm 13a colliding with the back plate 18 due to high sound pressure, the distortion vibration is not likely to influence the second acoustic sensing portion 23b, and the harmonic distortion ratio of the second acoustic sensing portion 23b is not likely to degrade. In other words, the second acoustic sensing portion 23b does not have the back plate 18 or the fixed electrode plate 19 as constituent elements, and therefore the output of the second acoustic sensing portion 23b is not influenced by distortion vibration of the back plate 18. As a result, it is possible to prevent the dynamic range of the acoustic sensor 11 from becoming narrower due to distortion vibration in the first acoustic sensing portion 23a.

As shown in FIG. 5, with the acoustic sensor 11 of Embodiment 1, the slits 17 are shifted toward the interior of the chamber 15 relative to the edges of the upper opening of the chamber 15, with the exception of the two end portions. As a result, in a view from a direction perpendicular to the upper surface of the silicon substrate 12, the first diaphragm 13a is not overlapped with the upper surface (the electrically conducting layer 21) of the silicon substrate 12, it is possible to reduce the parasitic capacitance between the first diaphragm 13a and the electrically conducting layer 21, and it is possible to reduce signal interference of the first acoustic sensing portion 23a.

Also, since air is trapped between the diaphragm 13 and the upper surface of the silicon substrate 12, there are cases where Brownian motion of air molecules trapped there is a cause of acoustic noise. However, with the acoustic sensor 11 of Embodiment 1, the slits 17 are provided between the first diaphragm 13a and the second diaphragm 13b, and moreover the slits 17 are shifted toward the interior of the chamber 15 relative to the edges of the upper opening of the chamber 15. For this reason, it is possible to eliminate the air trapped between the first diaphragm 13a and the upper surface of the silicon substrate 12, and since the influence of acoustic noise caused by air molecules trapped there is eliminated, it is possible to reduce acoustic noise in the first acoustic sensing portion 23a.

Examples of Different Anchor Arrangements

Figure 14:
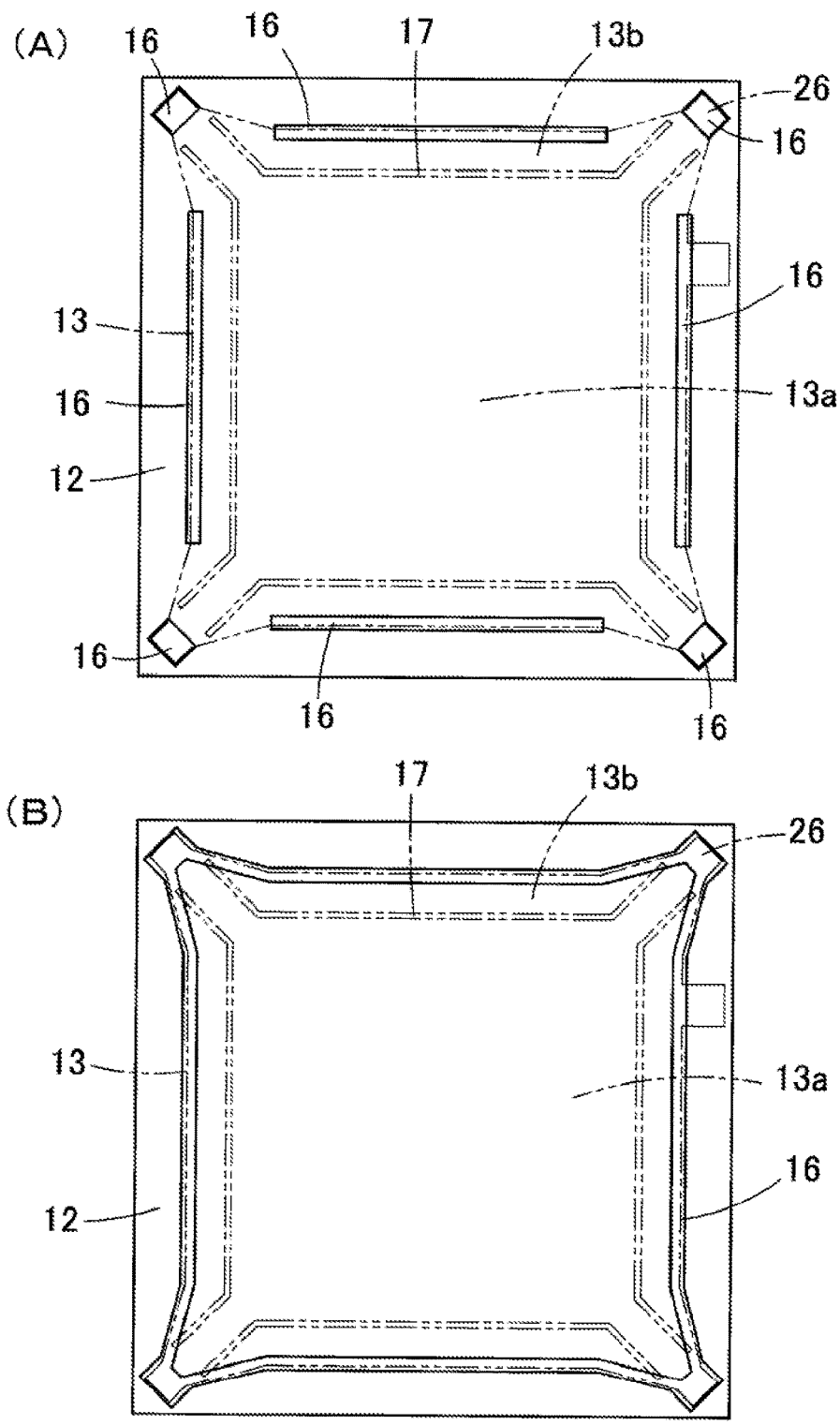
FIGS. 14(A) and 14(B) are plan views showing different anchor arrangement examples.
Figure 15:
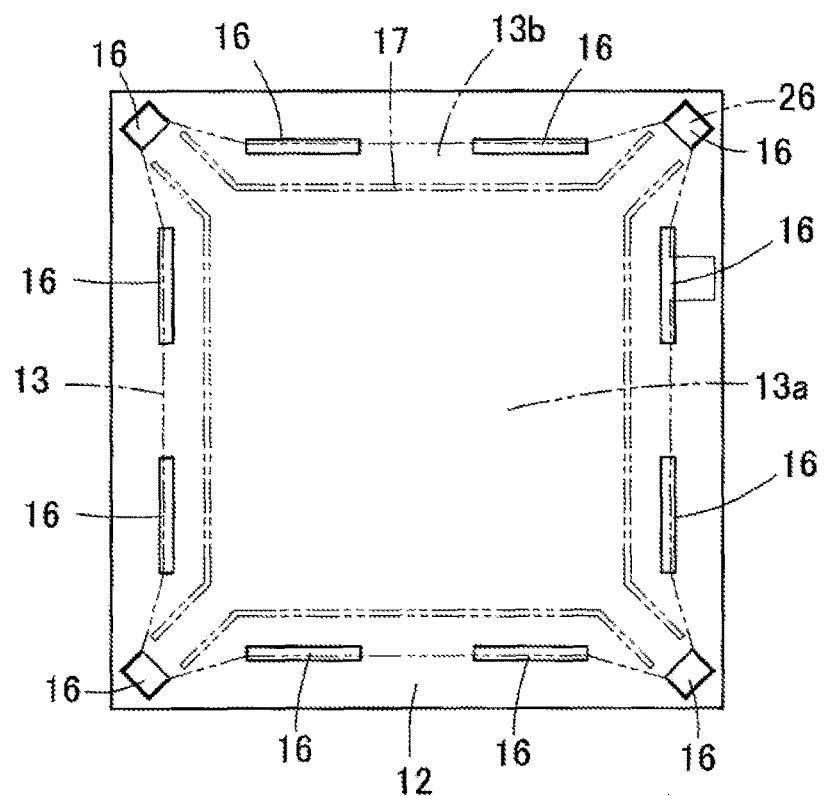
FIG. 15 is a plan view showing another different anchor arrangement example.

In Embodiment 1, the leg pieces 26 provided in the corner portions of the diaphragm 13 are supported by the anchors 16, but various modes are conceivable for the diaphragm 13 support structure as shown in FIGS. 14(A), 14(B), and 15.

In FIG. 14(A), an anchor 16 is added at the outer peripheral edge of each side of the second diaphragm 13b. In FIG. 14(B), an anchor 16 is provided for the entire outer peripheral edge of the second diaphragm 13b. In FIG. 15, anchors 16 are provided at intervals along the outer peripheral edge of the second diaphragm 13b. According to these modified examples, the diaphragm 13 and the second diaphragm 13b in particular can be reliably supported by anchors 16, thus making it possible to maintain independence between the vibration of the first acoustic sensing portion 23a and the second acoustic sensing portion 23b, and making it possible to prevent signals from interfering with each other.

Different Structures of Electrically Conducting Layer

Figure 16:
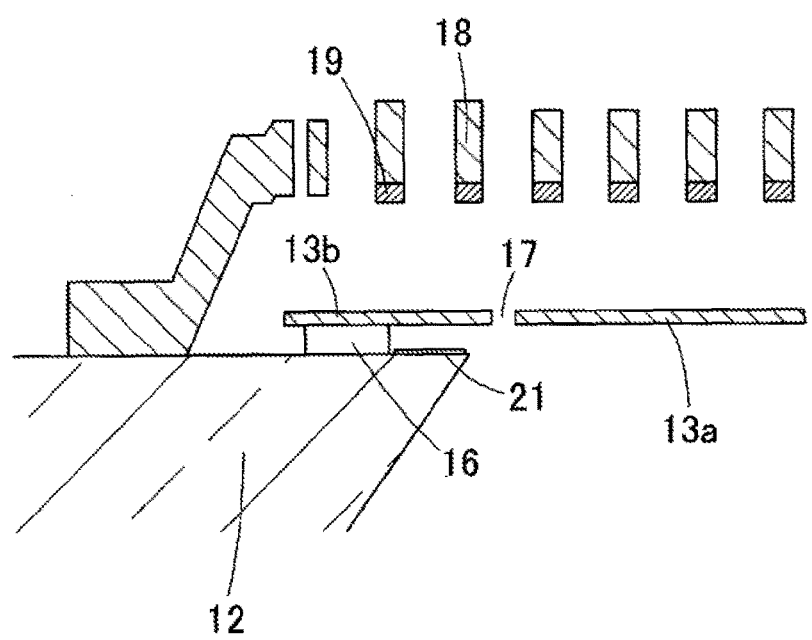
FIG. 16 is a cross-sectional diagram showing part of an acoustic sensor that includes an electrically conducting layer made up of a substrate electrode.

Also, the electrically conducting layer 21 on the upper surface of the silicon substrate 12 may be a substrate electrode formed by subjecting a metal thin film to patterning on the upper surface of the silicon substrate 12 as shown in FIG. 16. In this modified example, the area of the electrically conducting layer 21 is determined by the patterning area of the metal thin film, and therefore variation in the area of the electrically conducting layer 21 decreases.

Embodiment 2

Figure 17:
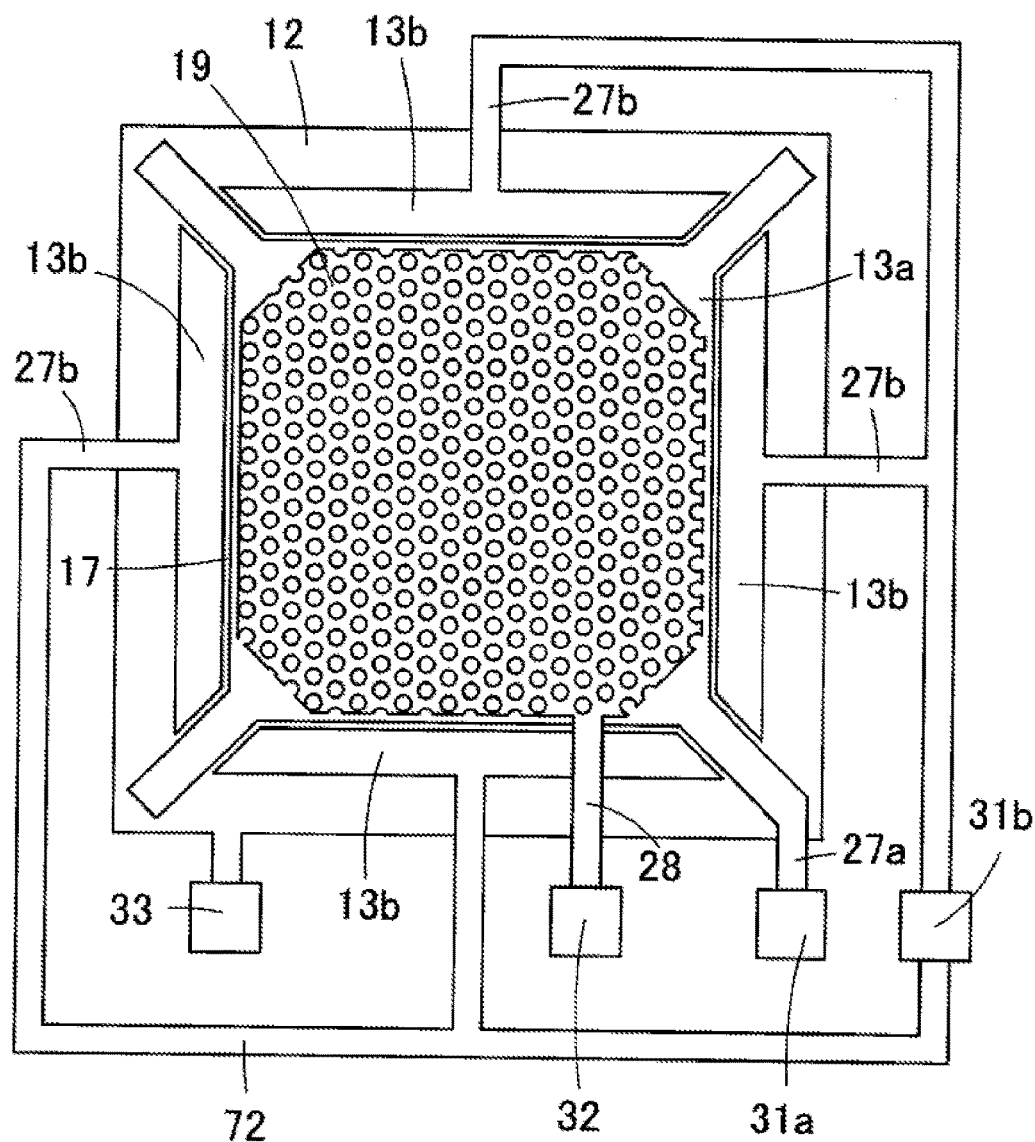
FIG. 17 is a plan view showing a state in which a back plate has been removed from an acoustic sensor according to Embodiment 2 of the present invention.

FIG. 17 is a schematic plan view of an acoustic sensor 71 according to Embodiment 2 of the present invention, in a state in which a back plate has been removed. In this embodiment, the first diaphragm 13a and four second diaphragms 13b on the sides thereof are completely separated from each other by the slits 17. Also, the first diaphragm 13a is connected to the electrode pad 31a on the back plate by a lead-out interconnect 27a drawn from the first diaphragm 13a. Moreover, a lead-out interconnect 27b is drawn from each of the four second diaphragms 13b, and these lead-out interconnects 27b are connected to the electrode pad 31b on the back plate by wiring 72.

According to this embodiment, the electrical wiring of the first diaphragm 13a of the first acoustic sensing portion 23a and the electrical wiring of the second diaphragm 13b of the second acoustic sensing portion 23b can be provided separately and independently, thus making it possible to reduce the parasitic capacitance between the first acoustic sensing portion 23a and the second acoustic sensing portion 23b and to make it unlikely for signals to interfere with each other.

Embodiment 3

Figure 18:
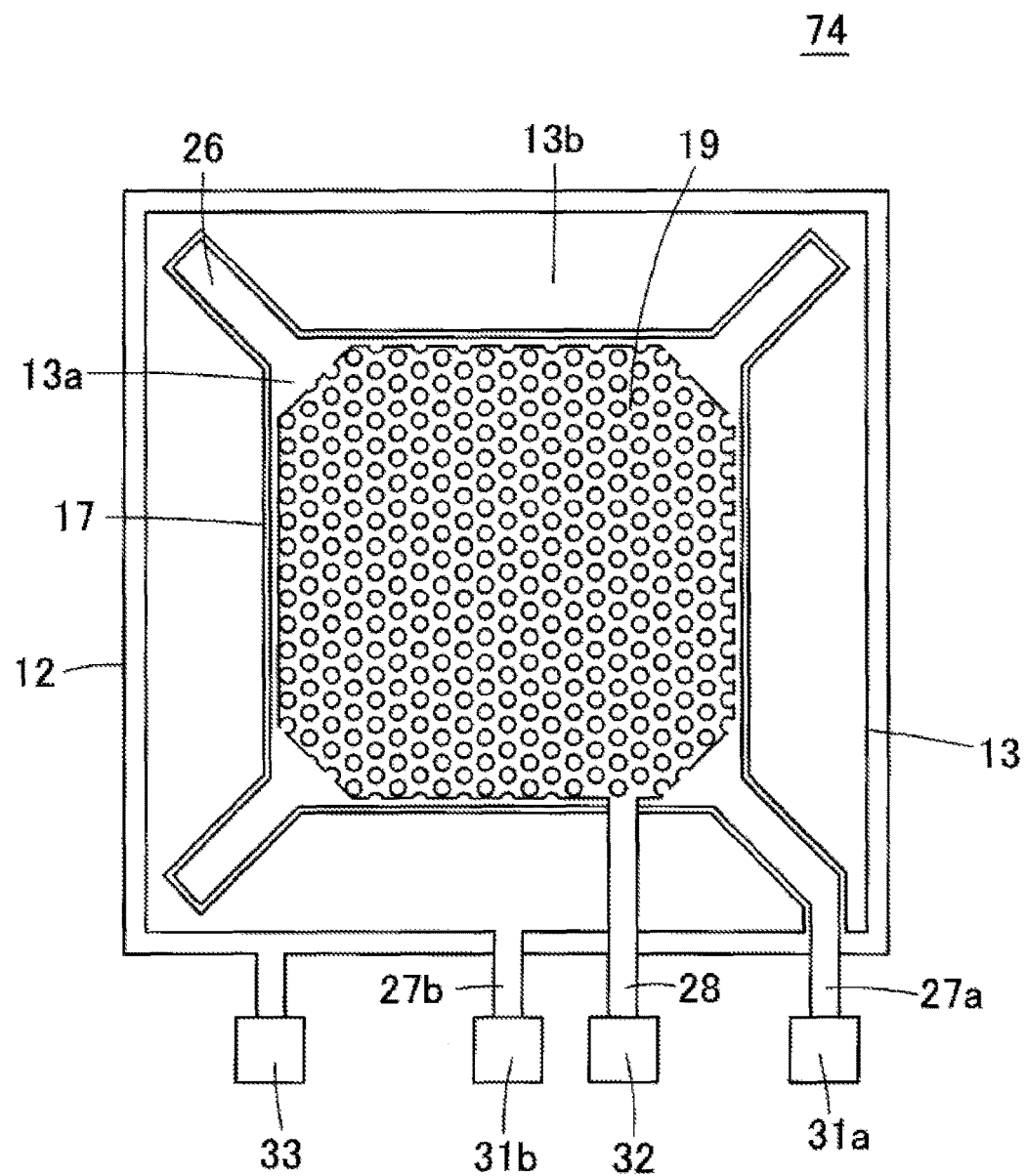
FIG. 18 is a plan view showing a state in which a back plate has been removed from an acoustic sensor according to Embodiment 3 of the present invention.

FIG. 18 is a schematic plan view of an acoustic sensor 74 according to Embodiment 3 of the present invention, in a state in which a back plate has been removed. In this embodiment, the first diaphragm 13a and the second diaphragm 13b are completely separated from each other by the slit 17. Meanwhile, the portions of the second diaphragm 13b on the respective sides are mechanically and electrically connected to each other in the corner portions of the diaphragm 13. Also, the first diaphragm 13a is connected to the electrode pad 31a on the back plate by a lead-out interconnect 27a drawn from the first diaphragm 13a. Moreover, the second diaphragm 13b is connected to the electrode pad 31b on the back plate by the lead-out interconnect 27b drawn from the second diaphragms 13b.

According to this embodiment, the electrical wiring of the first diaphragm 13a of the first acoustic sensing portion 23a and the electrical wiring of the second diaphragm 13b of the second acoustic sensing portion 23b can be provided separately and independently, thus making it possible to reduce the parasitic capacitance between the first acoustic sensing portion 23a and the second acoustic sensing portion 23b and to make it unlikely for signals to interfere with each other. Moreover, there is no need to connect the portions of the second diaphragm 13b on the respective sides to each other, thus making it possible to simplify the wiring.

Embodiment 4

Figure 19:
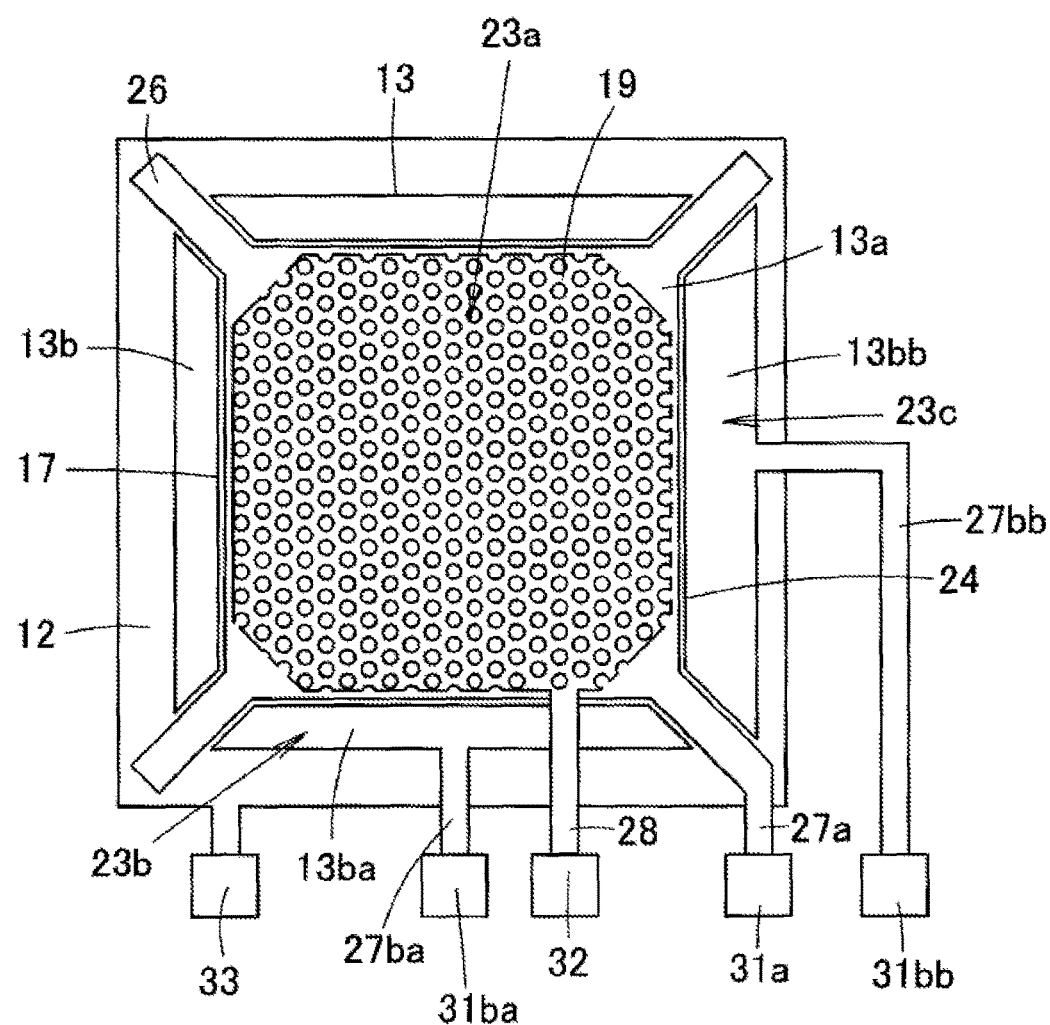
FIG. 19 is a plan view showing a state in which a back plate has been removed from an acoustic sensor according to Embodiment 4 of the present invention.

FIG. 19 is a schematic plan view of an acoustic sensor 76 according to Embodiment 4 of the present invention, in a state in which a back plate has been removed. In this embodiment, the first diaphragm 13a and four second diaphragms 13b on the sides thereof are completely separated from each other by the slits 17. Out of two second diaphragms 13ba and 13bb among the four second diaphragms 13b, the area of the one second diaphragm 13bb is larger than the area of the other second diaphragm 13ba. Also, a low-volume (high-sensitivity) first acoustic sensing portion 23a (first sensing portion) is constituted by the capacitance between the first diaphragm 13a and the fixed electrode plate 19. Moreover, a mid-volume (mid-sensitivity) second acoustic sensing portion 23c (second sensing portion) is constituted by the capacitance between the second diaphragm 13bb and the upper surface of the silicon substrate 12, and a high-volume (low-sensitivity) second acoustic sensing portion 23b (second sensing portion) is constituted by the capacitance between the second diaphragm 13ba and the upper surface of the silicon substrate 12. Also, the first diaphragm 13a is connected to the electrode pad 31a on the back plate by a lead-out interconnect 27a drawn from the first diaphragm 13a. The second diaphragm 13bb is connected to an electrode pad 31bb on the back plate by a lead-out interconnect 27bb. The second diaphragm 13ba is connected to an electrode pad 31ba on the back plate by a lead-out interconnect 27ba. Also, the fixed electrode plate 19 is connected to an electrode pad 32 on the back plate by a lead-out interconnect 28, and the upper surface (the electrically conducting layer 21) of the silicon substrate 12 is connected to the electrode pad 33.

According to this embodiment, the low-volume first acoustic sensing portion 23a, the mid-volume second acoustic sensing portion 23c, and the high-volume second acoustic sensing portion 23b are provided, thus making it possible to further widen the sound pressure range (dynamic range) of the acoustic sensor 76.

Embodiment 5

Figure 20:
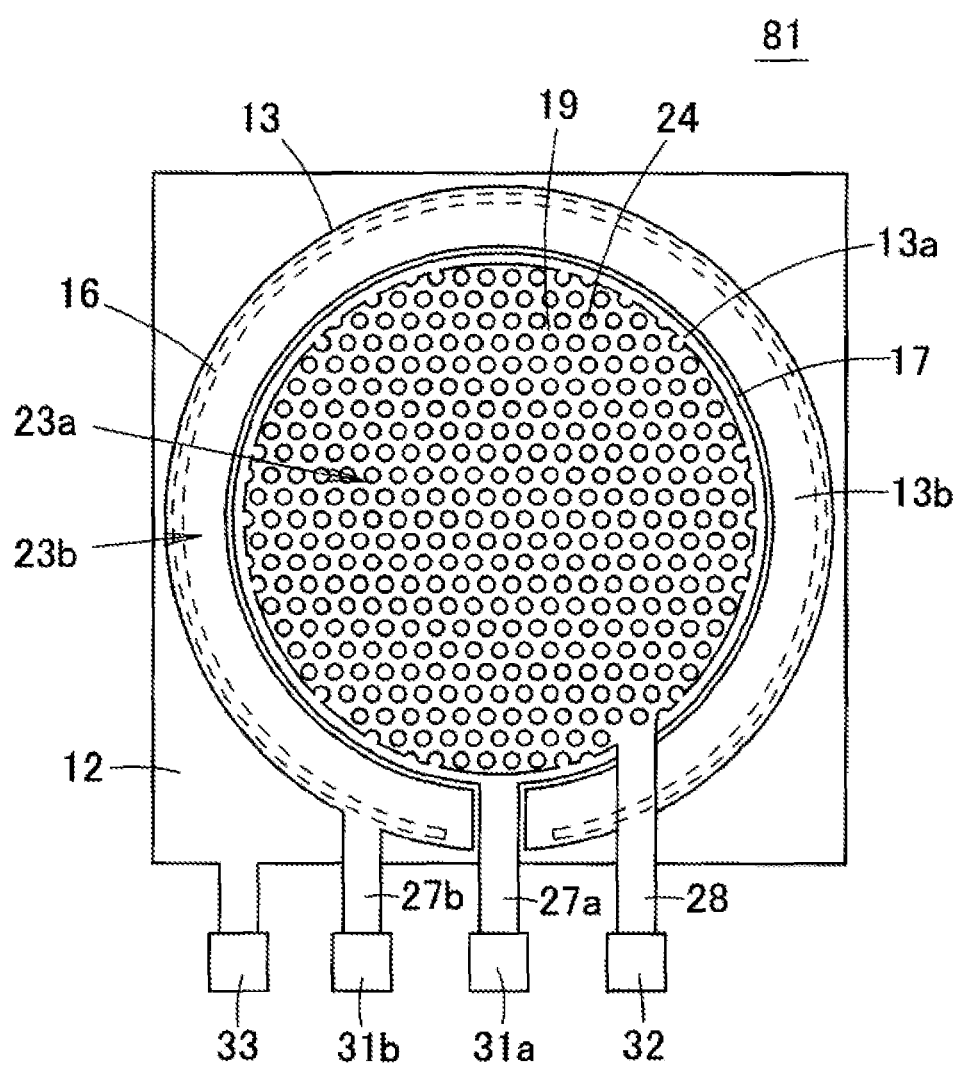
FIG. 20 is a plan view showing a state in which a back plate has been removed from an acoustic sensor according to Embodiment 5 of the present invention.

FIG. 20 is a schematic plan view of an acoustic sensor 81 according to Embodiment 5 of the present invention, in a state in which a back plate has been removed. In this embodiment, the circular diaphragm 13 is divided by the slit 17 into the arc-shaped second diaphragm 13b located on the outer peripheral side and the circular first diaphragm 13a located inward thereof. Also, the fixed electrode plate 19 is formed on the lower surface of the back chamber so as to oppose the first diaphragm 13a.

The first diaphragm 13a is supported in a cantilever manner above the chamber 15 due to the lead-out interconnect 27a being fixed to the silicon substrate 12 or the like. The low-volume first acoustic sensing portion 23a is constituted by the first diaphragm 13a and the fixed electrode plate 19.

The outer peripheral portion of the lower surface of the second diaphragm 13b is supported by an approximately arc-shaped anchor 16. The high-volume second acoustic sensing portion 23b is constituted by the second diaphragm 13b and the electrically conducting layer 21 of the silicon substrate 12.

Figure 21:
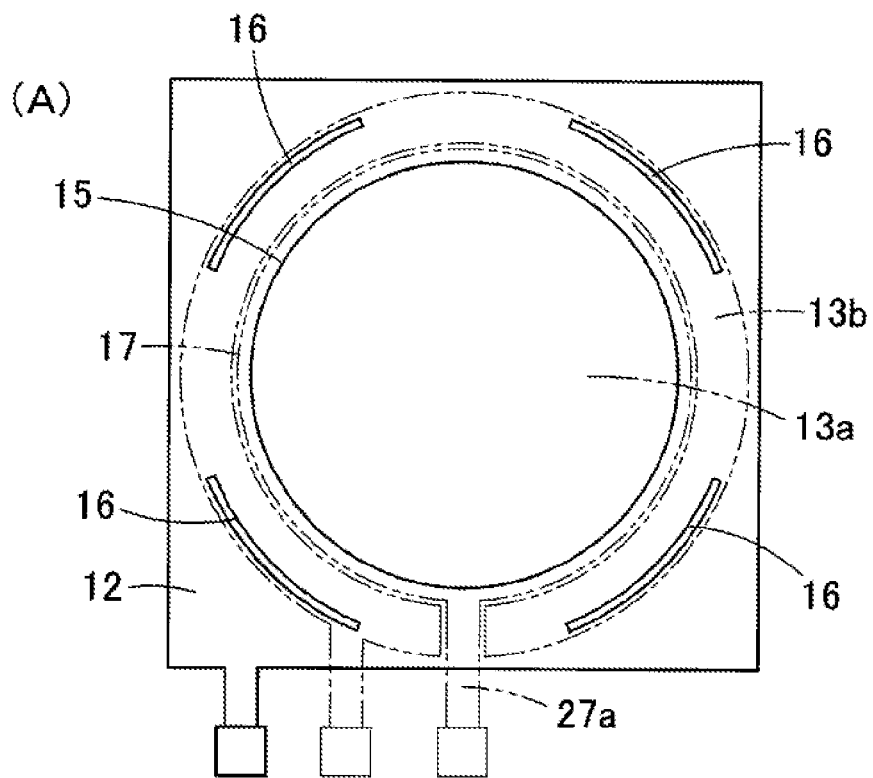
FIGS. 21(A) and 21(B) are schematic plan views showing different anchor arrangement examples in the acoustic sensor of Embodiment 5.
Figure 21:
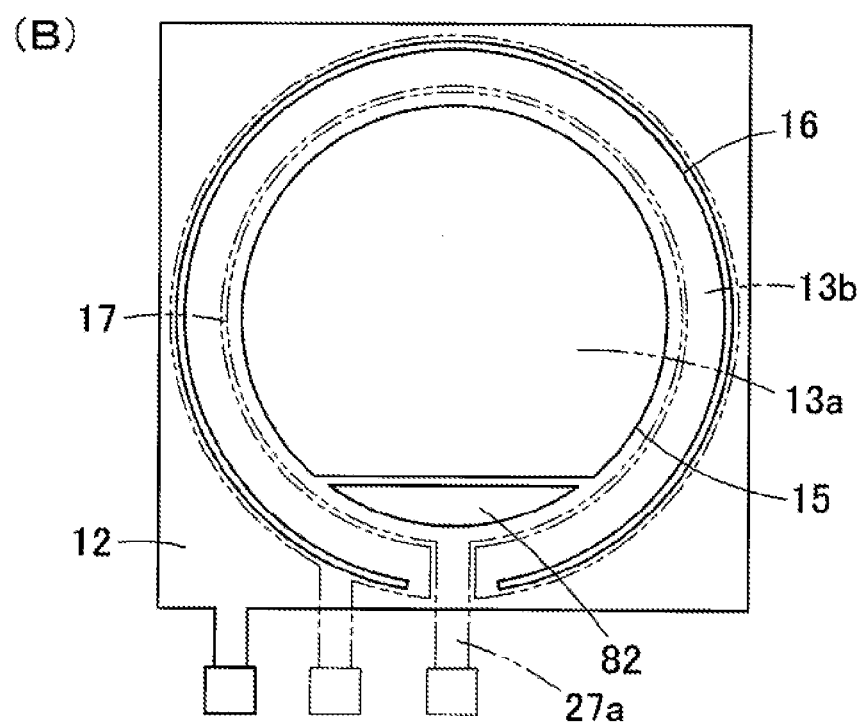

Note that anchors 16 may be provided at intervals along the outer peripheral portion of the lower surface of the second diaphragm 13b as shown in FIG. 21(A).

Also, as shown in FIG. 21(B), a configuration is possible in which a portion of the upper surface of the silicon substrate 12 protrudes toward the interior of the circular chamber 15, a half-moon shaped anchor 82 is provided on this portion, and an end of the first diaphragm 13a is supported in a cantilever manner by the anchor 82. Using this anchor 82 makes it possible to improve the strength of the first diaphragm 13a.

Although acoustic sensors and microphones using the acoustic sensors have been described above, the present invention is also applicable to a capacitance sensor other than an acoustic sensor, such as pressure sensor.

The invention claimed is:

1. A capacitive sensor comprising:
   a substrate having a cavity that is open at least at an upper surface;
   a vibrating electrode plate formed above the substrate so as to cover an upper portion of the cavity;
   a back plate formed above the substrate so as to cover the vibrating electrode plate; and
   a fixed electrode plate provided on the back plate,
   wherein the vibrating electrode plate is divided into a region located above the cavity and a region located above an upper surface of the substrate,
   a first sensing portion is formed by the fixed electrode plate and the region of the vibrating electrode plate located above the cavity, and
   a second sensing portion is formed by the upper surface of the substrate and the region of the vibrating electrode plate located above the upper surface of the substrate.

2. The capacitive sensor according to claim 1, wherein the vibrating electrode plate is divided, by a slit formed in the vibrating electrode plate, into a region that constitutes the first sensing portion and a region that constitutes the second sensing portion.

3. The capacitive sensor according to claim 1, wherein in a view from above the substrate, the fixed electrode plate is formed at a position that is not overlapped with a region of the vibrating electrode plate that constitutes the second sensing portion.

4. The capacitive sensor according to claim 1, wherein the vibrating electrode plate is divided into a region that constitutes the first sensing portion and a region that constitutes the second sensing portion, at a position shifted toward an interior of the cavity relative to an edge of an upper opening of the cavity.

5. The capacitive sensor according to claim 1, wherein the upper surface of the substrate is subjected to electrical conductivity processing.

6. The capacitive sensor according to claim 1, wherein a substrate electrode is formed on the upper surface of the substrate so as to oppose a region of the vibrating electrode plate that constitutes the second sensing portion.

7. The capacitive sensor according to claim 1, wherein a region of the vibrating electrode plate that constitutes the first sensing portion and a region of the vibrating electrode plate that constitutes the second sensing portion are partially continuous.

8. The capacitive sensor according to claim 1, wherein a lower surface of an outer peripheral edge of a region of the vibrating electrode plate that constitutes the second sensing portion is supported by a fixing portion provided on the upper surface of the substrate.

9. The capacitive sensor according to claim 1, wherein an area of a region of the vibrating electrode plate that constitutes the second sensing portion is smaller than an area of a region of the vibrating electrode plate that constitutes the first sensing portion.

10. The capacitive sensor according to claim 1, wherein a region of the vibrating electrode plate that constitutes the second sensing portion is further divided into a region that has a comparatively large area and a region that has a comparatively small area.

11. An acoustic sensor employing the capacitive sensor according to claim 1,
    wherein a plurality of holes for allowing passage of acoustic vibration is formed in the back plate and the fixed electrode plate, and
    signals of different sensitivities are output from the first sensing portion and the second sensing portion.

12. A microphone comprising the acoustic sensor according to claim 11 and a circuit portion that amplifies a signal from the acoustic sensor and outputs the amplified signal to the outside.

13. The microphone according to claim 12, wherein the circuit portion includes a phase inversion circuit that inverts the phase of one output signal out of an output signal from the first sensing portion and an output signal from the second sensing portion.

* * * * *